United States Patent
Ilda

(10) Patent No.: US 7,460,388 B2
(45) Date of Patent: Dec. 2, 2008

(54) SEMICONDUCTOR MEMORY DEVICE

(75) Inventor: Masahisa Ilda, Osaka (JP)

(73) Assignee: Panasonic Corporation, Osaka (JP)

( * ) Notice: Subject to any disclaimer, the term of this patent is extended or adjusted under 35 U.S.C. 154(b) by 65 days.

(21) Appl. No.: 11/783,956

(22) Filed: Apr. 13, 2007

(65) Prior Publication Data

US 2007/0242539 A1 Oct. 18, 2007

(30) Foreign Application Priority Data

Apr. 13, 2006 (JP) ............................ 2006-111197

(51) Int. Cl.
*G11C 5/06* (2006.01)
*G11C 7/00* (2006.01)

(52) U.S. Cl. .................... 365/63; 365/203; 365/205; 365/207; 365/208

(58) Field of Classification Search .................... 365/63, 365/203, 205, 207, 208
See application file for complete search history.

(56) References Cited

U.S. PATENT DOCUMENTS

| | | | |
|---|---|---|---|
| 4,658,377 A | 4/1987 | McElroy | |
| RE33,694 E | 9/1991 | McElroy | |
| 5,701,269 A * | 12/1997 | Fujii | ........................ 365/203 |
| 5,715,189 A | 2/1998 | Asakura | |
| 5,757,692 A | 5/1998 | Suh | |
| 5,828,594 A * | 10/1998 | Fujii | ............................ 365/63 |
| 5,917,744 A | 6/1999 | Kirihata et al. | |
| 5,917,745 A * | 6/1999 | Fujii | ............................ 365/63 |
| 5,973,983 A * | 10/1999 | Hidaka | ........................ 365/203 |
| 6,327,202 B1 * | 12/2001 | Roohparvar | ................ 365/203 |
| 6,373,741 B2 * | 4/2002 | Ferrant | ........................ 365/63 |
| 7,099,206 B2 * | 8/2006 | Dawson et al. | ................ 365/63 |
| 7,239,565 B2 * | 7/2007 | Liu | ............................ 365/203 |
| 7,417,911 B2 * | 8/2008 | Kuroda | ........................ 365/203 |

FOREIGN PATENT DOCUMENTS

| | | |
|---|---|---|
| JP | 63-66791 | 3/1988 |
| JP | 6-349267 | 12/1994 |

* cited by examiner

*Primary Examiner*—Trong Phan
(74) *Attorney, Agent, or Firm*—McDermott Will & Emery LLP

(57) ABSTRACT

A semiconductor memory device includes first and second global bit lines; first, second, third and fourth local bit lines; first, second, third and fourth hierarchical switches for respectively connecting the first global bit line and the first local bit line to each other, the second global bit line and the second local bit line to each other, the first global bit line and the third local bit line to each other, and the second global bit line and the fourth local bit line to each other; and first and second precharge circuits for respectively precharging the first and second global bit lines. When a memory cell connected to the first local bit line is read, the third hierarchical switch is turned off, and the first precharge circuit terminates its precharge operation after the third hierarchical switch is turned off and before a selected word line connected to the memory cell to be read is activated.

27 Claims, 17 Drawing Sheets

SEMICONDUCTOR MEMORY DEVICE

CROSS-REFERENCE TO RELATED APPLICATIONS

This application claims priority under 35 U.S.C. §119 on Patent Application No. 2006-111197 filed in Japan on Apr. 13, 2006, the entire contents of which are hereby incorporated by reference.

BACKGROUND OF THE INVENTION

The present invention relates to a semiconductor memory device, and more particularly, it relates to noise reduction and operation speed increase for a DRAM (dynamic random access memory) having a hierarchical bit line architecture.

Recently, an embedded-DRAM is required to have a high degree of integration for realizing an SOC (system-on-a-chip) at low cost. It is a memory cell array including memory cells and a column of sense amplifiers that occupies most of the memory area. In order to realize the high degree of integration, the area of the memory cells has been reduced by refinement technique for a memory capacitor using a memory cell transistor and a high dielectric constant insulating film.

On the other hand, the size reduction of a column of sense amplifiers has not been proceeded as much as that of memory cell transistors. This is for the following reason: Although a sense amplifier is required to accurately amplify a small signal read from a memory, when the size of transistors included in the sense amplifier is reduced, the electric characteristics are varied among the transistors, resulting in degrading the performance. Therefore, it is indispensable for reducing the memory area to increase the number of memory cells connected to one bit line so as to relatively reduce the number of sense amplifiers included in the memory cell array.

As a technique to reduce the number of sense amplifiers included in a memory cell array, hierarchical bit line architectures are disclosed in U.S. reissued Pat. No. RE33694 and Japanese Laid-Open Patent Publication No. 6-349267. For example, in the hierarchical bit line architecture disclosed in the latter publication, one global bit line pair is connected to a plurality of local bit line pairs through plurality of selecting means, and the global bit line pair is formed in a layer upper than the layer of the local bit line pairs.

The number of memory cells that can be connected to one bit line is determined depending upon the magnitude of a potential difference (sensing signal) $\Delta V$ caused between a bit line BL and its complementary bit line /BL when data of a memory cell is read out to the bit line BL. When the power supply voltage of the array is indicated by Vdd, parasitic capacitance per global bit line is indicated by Cbm, parasitic capacitance per local bit line is indicated by Cb1 and capacitance of a memory cell capacitor is indicated by Cs, the absolute value of the sensing signal $\Delta V$ is represented as follows:

$$|\Delta V|=(Vdd/2)/((Cb1+Cbm)/Cs+1)$$

At this point, it is assumed that a hierarchical bit line architecture includes one global bit line and N local bit lines formed in a layer lower than the layer of the global bit line. In this case, as far as Cbm<N×Cb1, a sensing signal can be made larger than in a non-hierarchical bit line architecture while increasing the number of memory cells connected to one bit line by N times (namely, while reducing the number of sense amplifiers to 1/N).

In a DRAM having a stacked capacitor structure, the parasitic capacitance Cbm corresponds to a sum of parasitic capacitance between a global bit line and a surrounding general interconnect conductor and gate capacitance of a sense amplifier portion. On the other hand, the parasitic capacitance Cb1 includes parasitic capacitance between a local bit line and upper/lower electrodes of a memory capacitor that are formed ultimately close to the local bit line by a special process rule, junction capacitance of a memory cell transistor, overlap capacitance between the local bit line and a word line, and the like. Therefore, in general, Cbm<Cb1.

Furthermore, in a sub-100 nm embedded-DRAM process more refined, there is a condition satisfying Cbm<N×Cb1, and hence, when a hierarchical bit line architecture is employed, a sensing signal capable of a stable operation can be secured while reducing the number of sense amplifiers.

FIG. 16 is a circuit diagram for showing the configuration of a conventional semiconductor memory device. FIG. 17 is a timing chart for showing a read operation of the semiconductor memory device of FIG. 16. The operation of the semiconductor memory device of FIG. 16 will now be described with reference to FIG. 17.

At time ta, precharge is terminated by setting a precharge control signal line PR to a ground voltage VSS. At time tb, a voltage of hierarchical switch control signal lines BSa<1:3> and BSb<1:3> (wherein, for example, BSa<1:3> indicates BSa<1> through BSa<3>) connected to hierarchical switches 31a through 33a and 31b through 33b other than hierarchical switches 30a and 30b for mutually connecting a local bit line and a global bit line of a block B0 to be accessed is set to the ground voltage VSS.

Thereafter, at time tc, a word line WL<n> is set to a boosted voltage VPP, and data is read on a bit line from a memory capacitor of a memory cell (charge sharing is performed). Then, at time td, a sense amplifier control signal line SAE is set to an array voltage VDD for starting amplification by a sense amplifier 12, so as to maximize a voltage between global bit lines BLm and /BLm.

At time te, the word line WL<n> and the sense amplifier control signal line SAE are set to the ground voltage VSS for turning off the sense amplifier 12, so as to activate all the hierarchical switch control signal lines BSa<0:3> and BSb<0:3> for starting the precharge. Thereafter, at time tf, the precharge control signal line PR is set to the boosted voltage VPP so as to start bit line precharge.

In such an operation, however, noise on the bit lines is larger than in a non-hierarchical bit line architecture, and hence, the operation characteristics are disadvantageously degraded as follows:

First, in turning off the hierarchical switches of the blocks not accessed at the time tb, coupling derived from a gate-source capacitance of a transistor included in each hierarchical switch causes common mode noise for lowering a bit line precharge level. This is noise peculiar to the hierarchical bit line architecture. In the hierarchical bit line architecture including four local bit lines per global bit line as shown in FIG. 16, three hierarchical switch transistors cause the coupling noise. The influence of this noise is more serious as the number of local bit lines is increased.

Secondly, noise from adjacent bit lines derived from side coupling capacitance with adjacent bit lines is caused during a period of the charge sharing when the data is read out to one of the bit lines from the memory capacitor with the word line activated at the time tc and during the amplification performed by the sense amplifier after the time td. In the hierarchical bit line architecture, the ratio of the side coupling capacitance to total bit line capacitance is larger than in the non-hierarchical bit line architecture.

A local bit line (corresponding to a global bit line in the non-hierarchical bit line architecture) has a large capacitance component including the parasitic capacitance with upper/lower electrodes of a memory capacitor formed ultimately close by the special process rule, the junction capacitance of a memory cell transistor and the overlap capacitance with a word line, and has relatively small coupling capacitance with an adjacent bit line. On the other hand, in a global bit line formed in an upper layer, the coupling capacitance with another bit line adjacent in the vicinity of a minimum pitch is dominant, and the ratio of the adjacent bit line capacitance to the total bit line capacitance is relatively large. As a result, the hierarchical bit line architecture is easily affected by the noise from adjacent bit lines.

In the design of a semiconductor memory device employing the hierarchical bit line architecture, the goal is set at increasing the number of memory cell transistors connected per bit line as much as possible for minimizing the area of a memory cell array. However, it is indispensable to solve the noise problem peculiar to the hierarchical bit line architecture because a detected signal is otherwise small.

Furthermore, in order to reduce the area of a memory cell array, a memory cell transistor is used as a hierarchical switch transistor. Since a portion of the memory cell array disposed beneath a first metal layer is laid out by using the special process rule, periodical arrangement of memory cells is necessary for easing the fabrication particularly in the sub-100 nm embedded-DRAM process (stacked capacitor type). (If any hierarchical switch is disposed against the periodicity of the arrangement, it is necessary to provide a dummy cell on a boundary between a memory cell and the hierarchical switch, and area overhead cannot be avoided.)

In a conventional memory cell transistor, for improving the characteristic for keeping capacitor charge, the source/drain are made of a non-silicide material, the contact resistance is as large as several k$\Omega$ or more, and the on current characteristic is sacrificed. Therefore, it is difficult to use such a transistor as a hierarchical switch, which is required to rapidly send charge between a global bit line and a local bit line.

In an embedded-DRAM employing the sub-100 nm process, what is called a "full metal memory cell" including the source/drain of a memory cell transistor made of salicide and a contact made of a metal material such as tungsten is practically used, and the on current characteristic of the memory cell transistor is improved. Accordingly, a memory cell transistor can be used as a hierarchical switch.

However, there is speed overhead derived from use of a hierarchical switch although it is small. In particular, in application where rapid random operation performance is required, there is a demand for a hierarchical bit line architecture in which the speed overhead is reduced and the circuit area is minimized.

SUMMARY OF THE INVENTION

An object of the invention is, in a semiconductor memory device having a hierarchical bit line architecture, suppressing bit line noise and improving a reading speed.

Specifically, the semiconductor memory device of this invention includes a plurality of memory cells arranged in the form of a matrix; first and second global bit lines corresponding to different columns of the plurality of memory cells; a sense amplifier for differentially amplifying a voltage between the first and second global bit lines; a first local bit line connected to memory cells, out of the plurality of memory cells, belonging to the column corresponding to the first global bit line; a second local bit line connected to memory cells, out of the plurality of memory cells, belonging to the column corresponding to the second global bit line and belonging to the same rows as the memory cells connected to the first local bit line; a third local bit line connected to memory cells, out of the plurality of memory cells, belonging to the column corresponding to the first global bit line and not connected to the first local bit line; a fourth local bit line connected to memory cells, out of the plurality of memory cells, belonging to the column corresponding to the second global bit line and belonging to the same rows as the memory cells connected to the third local bit line; a first hierarchical switch for mutually connecting the first global bit line and the first local bit line; a second hierarchical switch for mutually connecting the second global bit line and the second local bit line; a third hierarchical switch for mutually connecting the first global bit line and the third local bit line; a fourth hierarchical switch for mutually connecting the second global bit line and the fourth local bit line; a first precharge circuit connected between a precharge power source and the first global bit line for precharging the first global bit line; and a second precharge circuit connected between the precharge power source and the second global bit line for precharging the second global bit line, and when a memory cell connected to the first local bit line is read, the third hierarchical switch enters an off state from an on state, and the first precharge circuit terminates a precharge operation thereof after the third hierarchical switch enters the off state and before a selected word line connected to the memory cell to be read is activated.

According to the present invention, common mode noise of a bit line derived from gate-source coupling capacitance caused in turning off a hierarchical switch of a non-access block, that is, noise peculiar to the hierarchical bit line architecture, can be suppressed. Accordingly, the operation margin of the semiconductor memory device can be increased.

In the semiconductor memory device, the fourth hierarchical switch preferably enters an off state from an on state before the first precharge circuit terminates the precharge operation thereof, and the second precharge circuit preferably terminates a precharge operation thereof after the selected word line is activated and before the sense amplifier starts amplification.

Thus, noise from adjacent bit lines caused in a period of charge sharing, that is, noise more serious in the hierarchical bit line architecture, can be suppressed.

The semiconductor memory device preferably further includes a first local bit line precharge circuit connected between the precharge power source and the first local bit line for precharging the first local bit line; a second local bit line precharge circuit connected between the precharge power source and the second local bit line for precharging the second local bit line; a third local bit line precharge circuit connected between the precharge power source and the third local bit line for precharging the third local bit line; and a fourth local bit line precharge circuit connected between the precharge power source and the fourth local bit line for precharging the fourth local bit line, and the first local bit line precharge circuit preferably terminates a precharge operation thereof after the third and fourth hierarchical switches enter an off state and before the selected word line connected to the memory cell to be read is activated, and the second local bit line precharge circuit preferably terminates a precharge operation thereof after the selected word line is activated and before the sense amplifier starts the amplification.

Thus, the local bit line precharge can be performed not through a hierarchical switch, and hence, the precharge can be more rapidly performed, so as to realize a rapid memory cycle.

Furthermore, the first and third local bit line precharge circuits are preferably controlled in accordance with the same control signal as the first precharge circuit, and the second and fourth local bit line precharge circuits are preferably controlled in accordance with the same control signal as the second precharge circuit.

Thus, the circuit area can be reduced by using the common control signal.

Moreover, the third local bit line precharge circuit preferably continues a precharge operation thereof after the first local bit line precharge circuit terminates the precharge operation thereof, and the fourth local bit line precharge circuit preferably continues a precharge operation thereof after the second local bit line precharge circuit terminates the precharge operation thereof.

Thus, the local bit line can be definitely kept at a precharge level when not accessed, and therefore, the charge keeping characteristic can be prevented from degrading and the fault tolerance can be improved.

Furthermore, each of the first, second, third and fourth local bit line precharge circuits preferably includes one transistor or plural transistors each having substantially the same size as a memory cell transistor included in each of the plurality of memory cells.

Thus, a rapid local bit line precharge circuit with a small area can be easily fabricated.

Moreover, the one transistor or plural transistors included in each of the first, second, third and fourth local bit line precharge circuits preferably have substantially the same electric characteristic as the memory cell transistor included in each of the plurality of memory cells.

The semiconductor memory device of the invention preferably further includes a first equalizing circuit for mutually connecting the first local bit line and the second local bit line; and a second equalizing circuit for mutually connecting the third local bit line and the fourth local bit line, and the first and second equalizing circuits preferably enter an off state from an on state after the selected word line is activated and before the sense amplifier starts amplification.

Thus, the local bit line precharge can be rapidly performed while minimizing increase of the circuit area, so as to realize a rapid memory cycle.

Furthermore, each of the first and second equalizing circuits preferably includes one transistor or plural transistors each having substantially the same size as a memory cell transistor included in each of the plurality of memory cells.

Thus, a rapid local bit line equalizing circuit with a small area can be easily fabricated.

Also, the one transistor or plural transistors included in each of the first and second equalizing circuits preferably have substantially the same electric characteristic as the memory cell transistor included in each of the plurality of memory cells.

In the semiconductor memory device of the invention, it is preferred that a plurality of local bit lines respectively connected to different memory cells, out of the plurality of memory cells, belonging to the column corresponding to the first global bit line and not connected to the first local bit line are included as the third local bit line, that a plurality of hierarchical switches each for mutually connecting the first global bit line and corresponding one of the plurality of local bit lines included as the third local bit line are included as the third hierarchical switch, that each of the first, second, third and fourth hierarchical switches includes one transistor or plural transistors each having the same structure as a memory cell transistor included in each of the plurality of memory cells, and that one of the plurality of hierarchical switches included as the third hierarchical switch enters an off state from an on state after the first precharge circuit terminates the precharge operation thereof and before the selected word line is activated.

Thus, not only the noise peculiar to the hierarchical bit line architecture but also noise derived from gate-source capacitance of a memory cell transistor caused in selecting a word line can be suppressed.

In the semiconductor memory device, a plurality of local bit lines respectively connected to different memory cells, out of the plurality of memory cells, belonging to the column corresponding to the second global bit line and not connected to the second local bit line are preferably included as the fourth local bit line, a plurality of hierarchical switches each for mutually connecting the second global bit line and corresponding one of the plurality of local bit lines included as the fourth local bit line are preferably included as the fourth hierarchical switch, and at least one of the plurality of hierarchical switches included as the fourth hierarchical switch preferably enters an off state from an on state after the selected word line is activated and before the sense amplifier starts amplification.

Thus, potential variation of a reference bit line derived from adjacent bit line capacitance caused when potential of a reading bit line is varied through the charge sharing can be suppressed.

Furthermore, all of the plurality of hierarchical switches included as the fourth hierarchical switch preferably enter an off state from an on state after the selected word line is activated and before the sense amplifier starts the amplification.

Thus, the bit line noise can be suppressed.

In the semiconductor memory device, the first and second hierarchical switches are preferably placed in an off state during a given period including start of amplification performed by the sense amplifier.

Thus, the total bit line capacitance connected to the sense amplifier can be reduced at the start of the amplification of the sense amplifier, so as to make the sense amplifier perform rapid amplification.

Furthermore, the first global bit line and the second global bit line are preferably twisted.

Thus, since the global bit line pair is twisted, the bit line noise caused at the start of the amplification of the sense amplifier when the bit line potential is largely varied can be largely reduced.

Moreover, the first global bit line and the second global bit line preferably together form a folded bit line pair, and the first, second, third and fourth local bit lines are preferably arranged in an open bit line architecture.

Thus, since the first through fourth local bit lines are arranged in the open bit line architecture, the circuit area can be reduced.

In the semiconductor memory device, the first and second hierarchical switches are preferably placed in an off state during a given period after the sense amplifier starts amplification.

Thus, the total bit line capacitance connected to the sense amplifier can be reduced, so as to increase a speed of the sense amplifier for amplifying a signal to the maximum amplitude.

Also, the first global bit line and the second global bit line are preferably twisted.

Thus, since the global bit line pair is twisted, the bit line noise can be largely reduced during the amplification performed by the sense amplifier.

Furthermore, the first global bit line and the second global bit line preferably together form a folded bit line pair, and the first, second, third and fourth local bit lines are preferably arranged in an open bit line architecture.

Thus, since the first through fourth local bit lines are arranged in the open bit line architecture, the circuit area can be reduced.

In the semiconductor memory device, each of the first, second, third and fourth hierarchical switches preferably includes one transistor or plural transistors each having substantially the same size as a memory cell transistor included in each of the plurality of memory cells.

Thus, the layout of the memory cell array attains periodicity, and therefore, reduction in the circuit area and easiness in the fabrication can be both attained.

Furthermore, the one transistor or plural transistors included in each of the first, second, third and fourth hierarchical switches preferably have substantially the same electric characteristic as the memory cell transistor included in each of the plurality of memory cells.

Moreover, a negative voltage is preferably supplied as a control voltage for placing the memory cell transistor included in each of the plurality of memory cells and the first, second, third and fourth hierarchical switches in an off state.

Thus, a leakage current otherwise caused in an off state can be suppressed, and hence, the threshold voltages of the memory cell transistor and each hierarchical switch can be low. Therefore, the on current of the memory cell transistor and the hierarchical switch can be increased so that data of a memory cell can be more rapidly transmitted to a global bit line.

Furthermore, a control voltage supplied for placing the memory cell transistor included in each of the plurality of memory cells in an on state is preferably lower than a control voltage supplied for placing the first, second, third and fourth hierarchical switches in an on state.

Thus, the control voltage according to a necessary charge transferring speed can be supplied to the memory cell transistor and the hierarchical switch, and hence, small power consumption can be attained.

Moreover, it is preferred that a negative voltage is supplied as a control voltage for placing the memory cell transistor included in each of the plurality of memory cells in an off state, and that a ground voltage is supplied as a control voltage for placing the first, second, third and fourth hierarchical switches in an off state.

Thus, the level of a negative voltage power source can be stabilized with the supply of the negative voltage suppressed, and the charge keeping characteristic and the small power consumption characteristic of a memory capacitor can be improved.

Furthermore, a control voltage supplied for placing the memory cell transistor included in each of the plurality of memory cells in an on state is preferably lower than a control voltage supplied for placing the first; second, third and fourth hierarchical switches in an on state.

Thus, the control voltage according to a necessary charge transferring speed can be supplied to the memory cell transistor and the hierarchical switch, and hence, small power consumption can be attained.

In the semiconductor memory device, each of the first, second, third and fourth hierarchical switches preferably has a threshold voltage lower than a threshold voltage of a memory cell transistor included in each of the plurality of memory cells.

Thus, each hierarchical switch can rapidly transfer charge.

In the semiconductor memory device, a voltage output by the precharge power source is preferably a ground voltage.

Thus, during the period of the charge sharing and during the amplification performed by the sense amplifier, a voltage between the gate and the source of the hierarchical switch can be increased, so as to improve the charge transferring speed of the hierarchical switch.

According to the present invention, in a semiconductor memory device having the hierarchical bit line architecture, the timing for operating the hierarchical switch is controlled for suppressing bit line noise. Accordingly, the operation margin of the semiconductor memory device can be increased.

DETAILED DESCRIPTION OF THE INVENTION

A preferred embodiment of the present invention will now be described with reference to the accompanying drawings.

Figure 1:
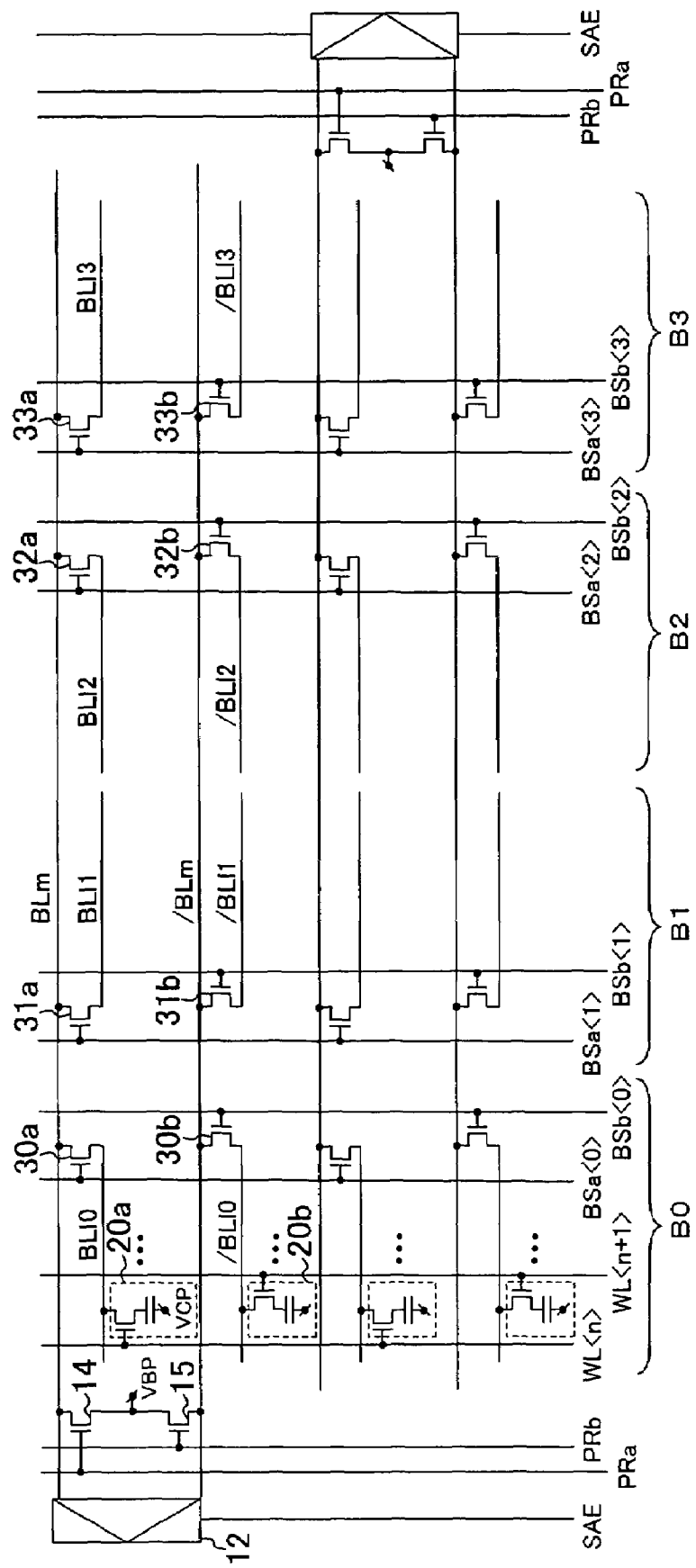
FIG. 1 is a circuit diagram for showing the configuration of a semiconductor memory device according to an embodiment of the invention.

FIG. 1 is a circuit diagram for showing the configuration of a semiconductor memory device of this embodiment. The semiconductor memory device of FIG. 1 includes a plurality of memory cells 20a, 20b, etc. arranged in the form of a matrix, and each of the memory cells includes a memory cell transistor and a capacitor. Each capacitor is provided with a cell plate voltage VCP. Although omitted in FIG. 1, memory cells are similarly arranged also on sides of the memory cells 20a, 20b, etc.

Apart from these memory cells, the semiconductor memory device of FIG. 1 includes, in a portion related to the memory cells 20a and 20b, a sense amplifier 12, precharge transistors 14 and 15 working as a precharge circuit, hierarchical switches 30a, 30b, 31a, 31b, 32a, 32b, 33a and 33b, global bit lines BLm and /BLm, and local bit lines BL10, /BL10, BL11, /BL11, BL12, /BL12, BL13 and /BL13. Although not shown in the drawing, the semiconductor memory device of FIG. 1 includes a control part for outputting control signals to respective components.

The global bit lines BLm and /BLm together form a folded global bit line pair. Herein, a global bit line connected to a memory cell to be read (for example, the global bit line BLm) is designated as a reading global bit line and the other global bit line (for example, the global bit line /BLm) is designated as a reference global bit line. Combinations of the local bit lines BL10 and /BL10, the local bit lines BL11 and /BL11, the local bit lines BL12 and /BL12 and the local bit lines BL13 and /BL13 respectively form local bit line pairs.

Furthermore, the semiconductor memory device of FIG. 1 has a similar configuration repeatedly along the vertical direction of FIG. 1, and further includes word lines WL<n>, WL<n+1>, etc., hierarchical switch control signal lines BSa<0>, BSb<0>, BSa<1>, BSb<1>, BSa<2>, BSb<2>, BSa<3> and BSb<3>, precharge control signal lines PRa and PRb and a sense amplifier control signal line SAE. Although omitted in FIG. 1, word lines are similarly repeatedly arranged on the right hand side of the word line WL<n+1>.

A memory cell array has four blocks B0, B1, B2 and B3 as shown in FIG. 1. Herein, a block including a memory cell to be accessed is designated as an access block and the other blocks are designated as non-access blocks.

A plurality of memory cells 20a are connected to each of the local bit lines BL10 through BL13, and a plurality of memory cells 20b are connected to each of the local bit lines /BL10 through /BL13.

The hierarchical switch 30a is connected between the global bit line BLm and the local bit line BL10, and the hierarchical switch 30b is connected between the global bit line /BLm and the local bit line /BL10. Also, the hierarchical switch 31a is connected between the global bit line BLm and the local bit line BL11, and the hierarchical switch 31b is connected between the global bit line /BLm and the local bit line /BL11, the hierarchical switch 32a is connected between the global bit line BLm and the local bit line BL12, and the hierarchical switch 32b is connected between the global bit line /BLm and the local bit line /BL12, the hierarchical switch 33a is connected between the global bit line BLm and the local bit line BL13, and the hierarchical switch 33b is connected between the global bit line /BLm and the local bit line /BL13. Each of the hierarchical switches 30a through 33a and 30b through 33b is, for example, an NMOS (n-channel metal oxide semiconductor) transistor.

The precharge transistor 14 is connected between a precharge power source and the global bit line BLm, and the precharge transistor 15 is connected between the precharge power source and the global bit line /BLm. The precharge transistor 14 supplies a bit line precharge voltage VBP output from the precharge power source to the global bit line BLm in accordance with a signal on the precharge control signal line PRa, and the precharge transistor 15 supplies the bit line precharge voltage VBP to the global bit line /BLm in accordance with a signal on the precharge control signal line PRb. The sense amplifier 12 differentially amplifies a voltage between the global bit lines BLm and /BLm in accordance with a signal on the sense amplifier control signal line SAE.

Figure 2:
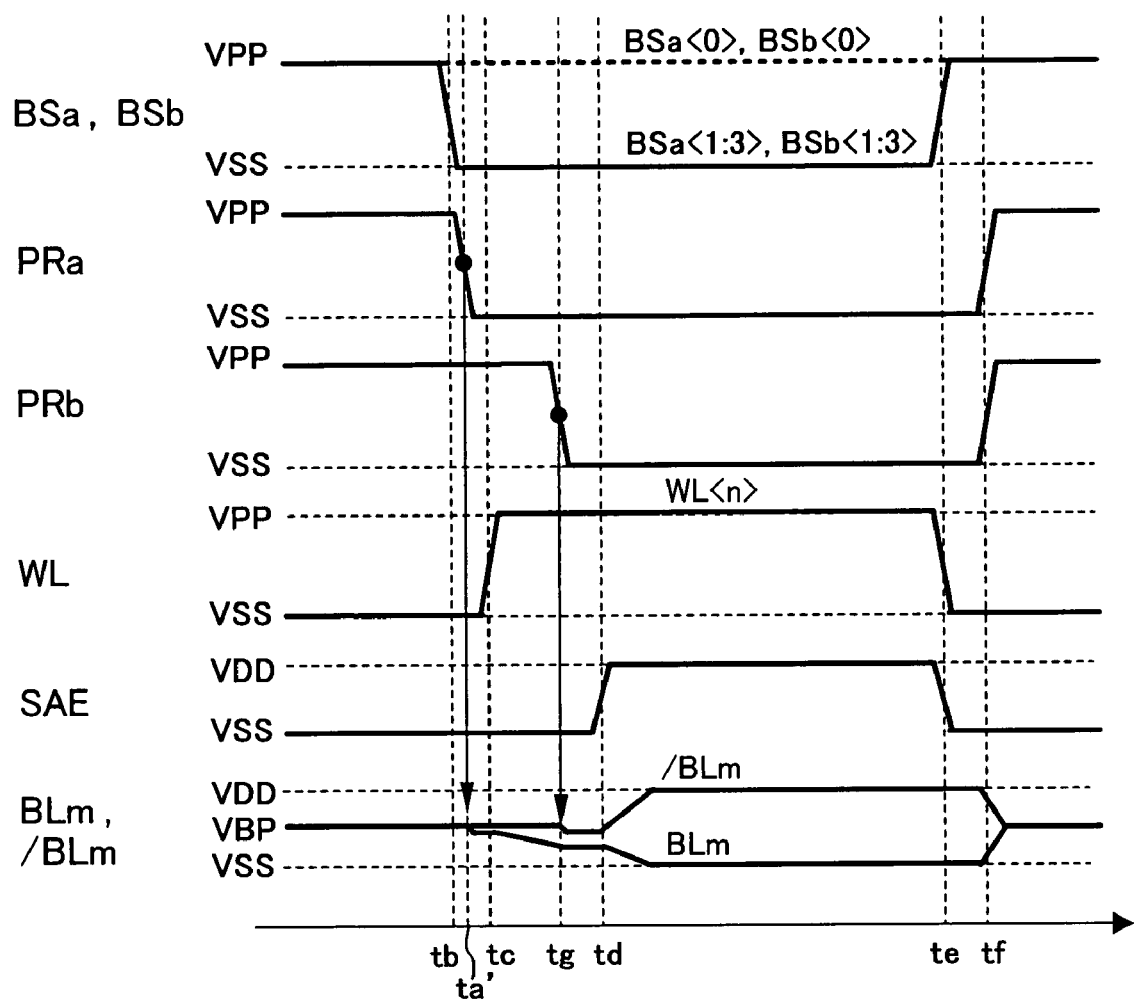
FIG. 2 is a timing chart for showing a read operation of the semiconductor memory device of FIG. 1.

FIG. 2 is a timing chart for showing a read operation of the semiconductor memory device of FIG. 1. Now, a case of reading data from the memory cell 20a connected to the word line WL<n> and the local bit line BL10 will be described with reference to FIGS. 1 and 2. Herein, for example, hierarchical switch control signal lines BSa<0:3> mean the hierarchical switch control signal lines BSa<0> through BSa<3>, and other signal lines are similarly expressed.

Before starting the read operation, the hierarchical switch control signal lines SBa<0:3> and BSb<0:3> are set to a boosted voltage VPP, so as to turn on all the hierarchical switches 30a through 33a and 30b through 33b. Furthermore, the precharge control signal lines PRa and PRb are also set to the boosted voltage VPP so as to turn on the precharge transistors 14 and 15, and hence, all the global bit lines BLm and /BLm, etc. and all the local bit lines BL10 through BL13, /BL10 through /BL13, etc. are precharged.

Since the block B0 is to be accessed, the hierarchical switches 30a, 30b, etc. of the block B0 are placed in an on state without changing the voltage of the hierarchical switch control signal lines BSa<0> and BSb<0>. At time tb, the hierarchical switch control signal lines BSa<1:3> and BSb<1:3> are set to a ground voltage VSS, so as to turn off the hierarchical switches 31a through 33a and 31b through 33b, etc. of the blocks B1 through B3.

Next, at time ta', the precharge control signal line PRa is set to the ground voltage VSS, so as to turn off the precharge transistor 14, and thus, the precharge of the reading global bit line BLm is terminated. Subsequently, at time tc, the word line WL<n> is set to the boosted voltage VPP, so as to read data from a memory capacitor of the memory cell to be read onto the bit line (charge sharing is performed).

At time tg after terminating the charge sharing, the precharge control signal line PRb is set to the ground voltage VSS, so as to turn off the precharge transistor 15, and thus, the precharge of the reference global bit line /BLm is terminated. Thereafter, at time td, the sense amplifier control signal line SAE is set to an array voltage VDD, so as to make the sense amplifier 12 start amplification for maximizing a voltage between the global bit lines BLm and /BLm.

Thereafter, at time te, the word line WL<n> and the sense amplifier control signal line SAE are set to the ground voltage VSS so as to turn off the sense amplifier 12, and all the hierarchical switch control signal lines BSa<0:3> and BSb<0:3> are activated so as to turn on all the hierarchical switches 30a through 33a and 30b through 33b, etc. Then, at time tf, the precharge control signal lines PRa and PRb are set to the boosted voltage VPP so as to start bit line precharge.

Through the aforementioned operation, noise peculiar to the hierarchical bit line architecture, that is, common mode noise of a bit line derived from gate-source coupling capacitance caused in turning off a hierarchical switch of a non-access block, can be suppressed, and in addition, noise from adjacent bit lines that is caused during the charge sharing period (from the time tc to the time tg) and is more serious in the hierarchical bit line architecture can be also suppressed. As a result, the operation margin can be increased.

The significant point is control timing that the hierarchical switches of blocks other than the access block are first turned off (at the time tb) and the precharge of the reading global bit line BLm is subsequently terminated (at the time ta').

If the precharge of the reading global bit line BLm is first terminated and then, the hierarchical switches of blocks other than the access block are turned off, the noise peculiar to the hierarchical bit line architecture is increased and the reading margin is reduced for the following reason:

First, since the bit line precharge is terminated before turning off the hierarchical switches, the common mode noise of the bit line derived from the gate-source coupling capacitance is caused.

Secondly, bit line coupling derived from capacitance between the gate and the source of the precharge transistor 15 (namely, between the precharge control signal line PRb and the global bit line /BLm) obtained in terminating the precharge of the reference global bit line is larger than bit line coupling derived from capacitance between the gate and the source of the precharge transistor 14 (namely, between the precharge control signal line PRa and the global bit line BLm) obtained in terminating the precharge of the reading global bit line. Therefore, this difference causes differential noise between the bit lines so as to reduce the operation margin.

The bit line coupling is thus different for the following reason: At the stage where the precharge transistor 14 is turned off (placed in an off state), all the hierarchical switches are in an on state and the bit line capacitance is "heavy". On the other hand, at the stage where the precharge transistor 15 is turned off, the hierarchical switches of merely the access block are in an on state and the bit line capacitance is "light".

In this embodiment, at the stage where either of the precharge transistors 14 and 15 is turned off, the hierarchical switches of merely the access block are in an on state. Therefore, the bit line capacitance is equal, and hence, no differential noise between the bit lines is caused.

For reducing the area of the memory cell array, each of the hierarchical switches 30a through 33a and 30b through 33b may be constructed from one transistor or a plurality of transistors each having a similar structure to the memory cell transistor. In particular, in an embedded-DRAM employing the sub-100 nm process, a layer of the memory cell array disposed beneath a first metal layer is laid out by the special process rule, and hence, periodical arrangement of the memory cells is necessary for easing the fabrication.

In the case where large power is necessary for transferring charge of a local bit line to a global bit line, a plurality of memory cell transistors mutually connected in parallel may be used as one hierarchical switch, or a transistor having the same size as the memory cell transistor and a lower threshold voltage than the memory cell transistor may be used as the hierarchical switch.

Although the number of blocks is four in this embodiment, the number of blocks may be other than four. Furthermore, the semiconductor memory device may further include equalizing means for the global bit lines.

Modification 1

Figure 3:
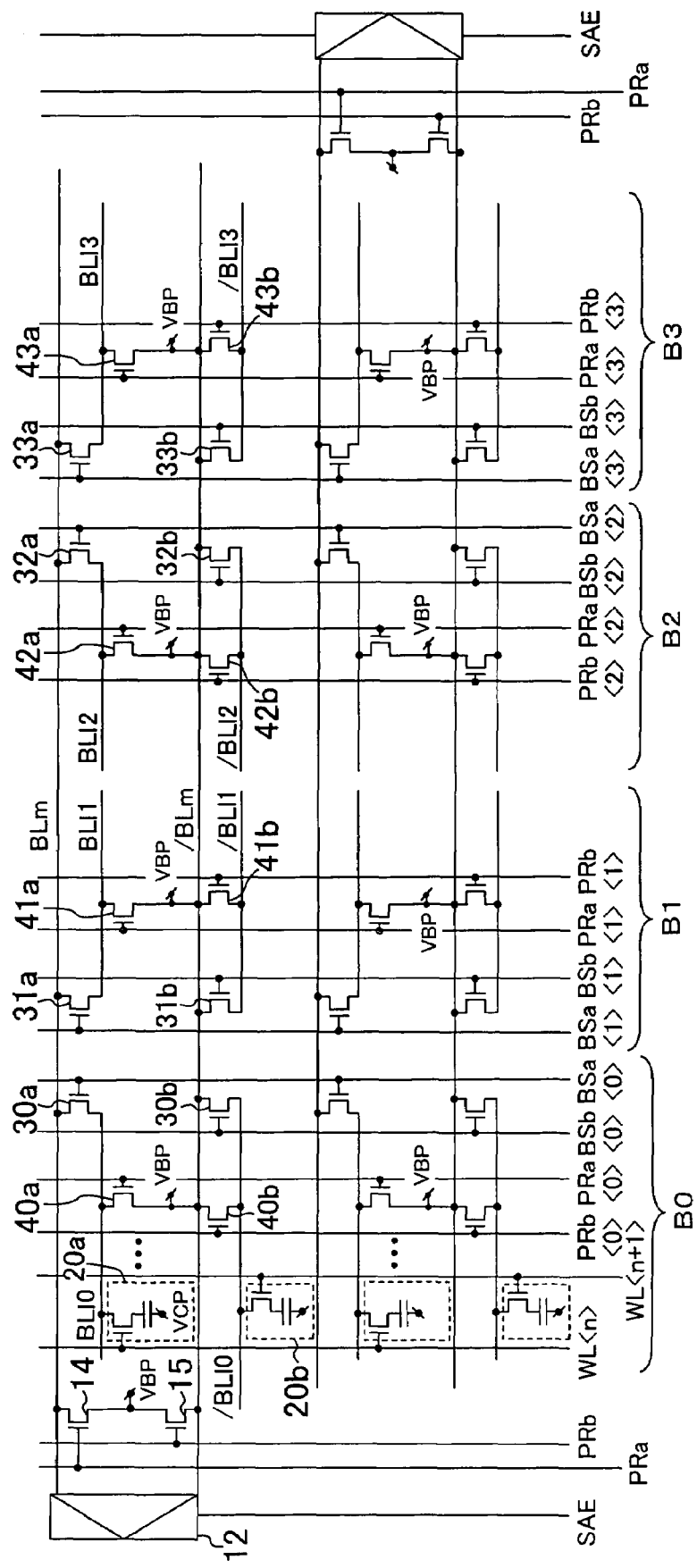
FIG. 3 is a circuit diagram for showing the configuration of a semiconductor memory device according to Modification 1.

FIG. 3 is a circuit diagram for showing the configuration of a semiconductor memory device according to Modification 1. In the semiconductor memory device of FIG. 3, precharge transistors 40a, 40b, 41a, 41b, 42a, 42b, 43a, 43b, etc. working as local bit line precharge circuits are further provided in the semiconductor memory device of FIG. 1.

The precharge transistor 40a is connected between the precharge power source and the local bit line BL10, and the precharge transistor 40b is connected between the precharge power source and the local bit line /BL10.

The precharge transistor 40a supplies the bit line precharge voltage VBP to the local bit line BL10 in accordance with a signal on a precharge control signal line PRa<0>, and the precharge transistor 40b supplies the bit line precharge voltage VBP to the local bit line /BL10 in accordance with a signal on a precharge control signal line PRb<0>.

Similarly, the precharge transistor 41a is connected between the precharge power source and the local bit line BL11, and the precharge transistor 41b is connected between the precharge power source and the local bit line /BL11. The precharge transistor 42a is connected between the precharge power source and the local bit line BL12, and the precharge transistor 42b is connected between the precharge power source and the local bit line /BL12. The precharge transistor 43a is connected between the precharge power source and the local bit line BL13, and the precharge transistor 43b is connected between the precharge power source and the local bit line /BL13.

The precharge transistors 41a through 43a respectively supply the bit line precharge voltage VBP to the local bit lines BL11 through BL13 in accordance with signals on precharge control signal lines PRa<1:3>, and the precharge transistors 41b through 43b respectively supply the bit line precharge voltage VBP to the local bit lines /BL10 through /BL13 in accordance with signals on precharge control signal lines PRb<1:3>.

Figure 4:
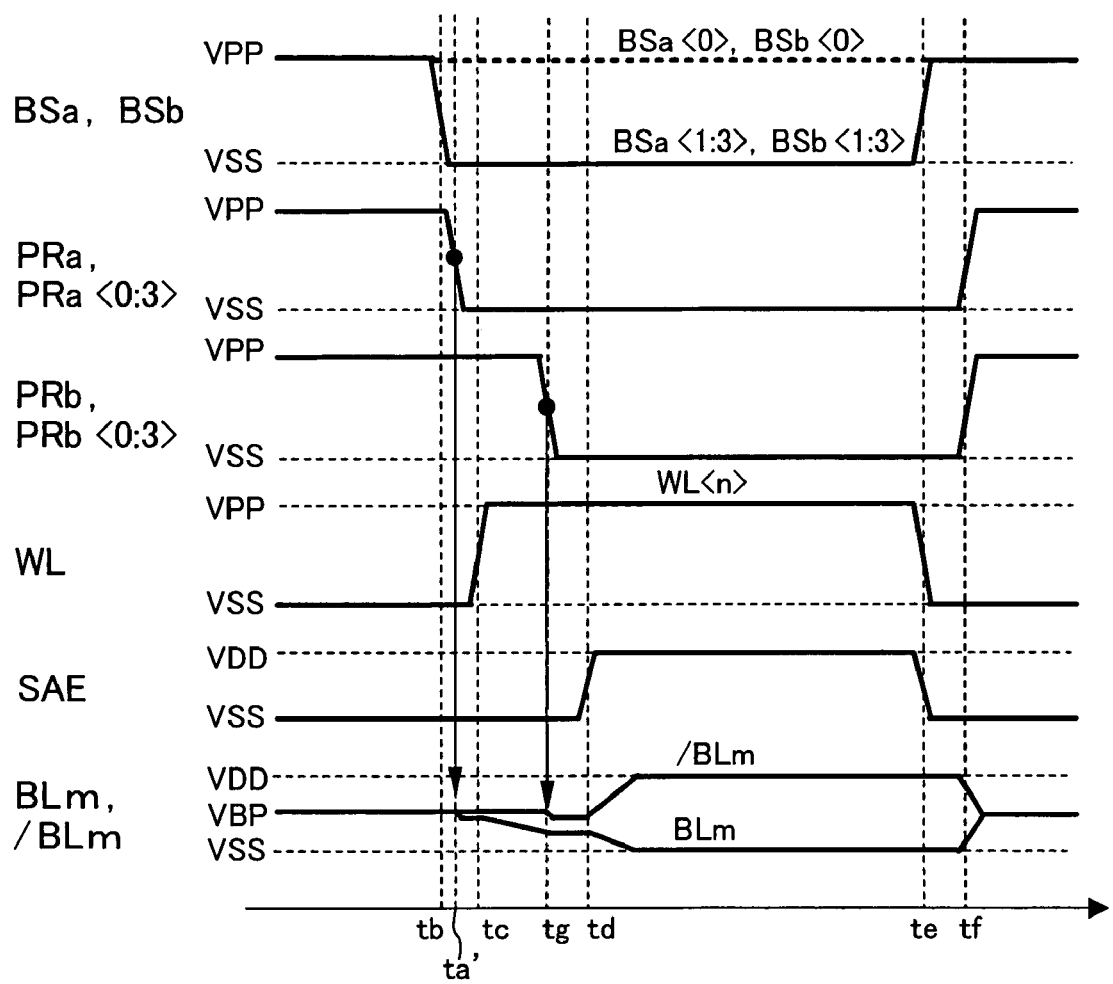
FIG. 4 is a timing chart for showing a read operation of the semiconductor memory device of FIG. 3.

FIG. 4 is a timing chart for showing a read operation of the semiconductor memory device of FIG. 3. In the semiconductor memory device of FIG. 3, a signal the same as that on the precharge control signal line PRa for controlling the precharge transistor 14 connected to the global bit line pair is supplied to the precharge control signal lines PRa<0:3>, and a signal the same as that on the precharge control signal line PRb for controlling the precharge transistor 15 is supplied to the precharge control signal lines PRb<0:3>. The rest of the read operation is performed in the same manner as in the semiconductor memory device of FIG. 1.

In the semiconductor memory device of FIG. 3, the local bit lines can be precharged not through the hierarchical switches, and hence, the precharge can be performed more rapidly, resulting in realizing a rapid memory cycle.

Moreover, for reducing the area of the memory cell array, each of the precharge transistors 40a through 43a and 40b through 43b connected to the local bit lines may be constructed from one transistor or a plurality of transistors each having the same structure as the memory cell transistor, namely, having substantially the same size as the memory cell transistor, and in particularly, having substantially the same electric characteristic. Since the total parasitic capacitance of the local bit lines is smaller than bit line capacitance of a non-hierarchical bit line architecture, sufficient precharge performance can be realized even at a current that can pass through a memory cell transistor. In the case where the precharge speed for a local bit line is desired to be further increase, a plurality of memory cell transistors mutually connected in parallel may be used as one precharge transistor.

Modification 2

Figure 5:
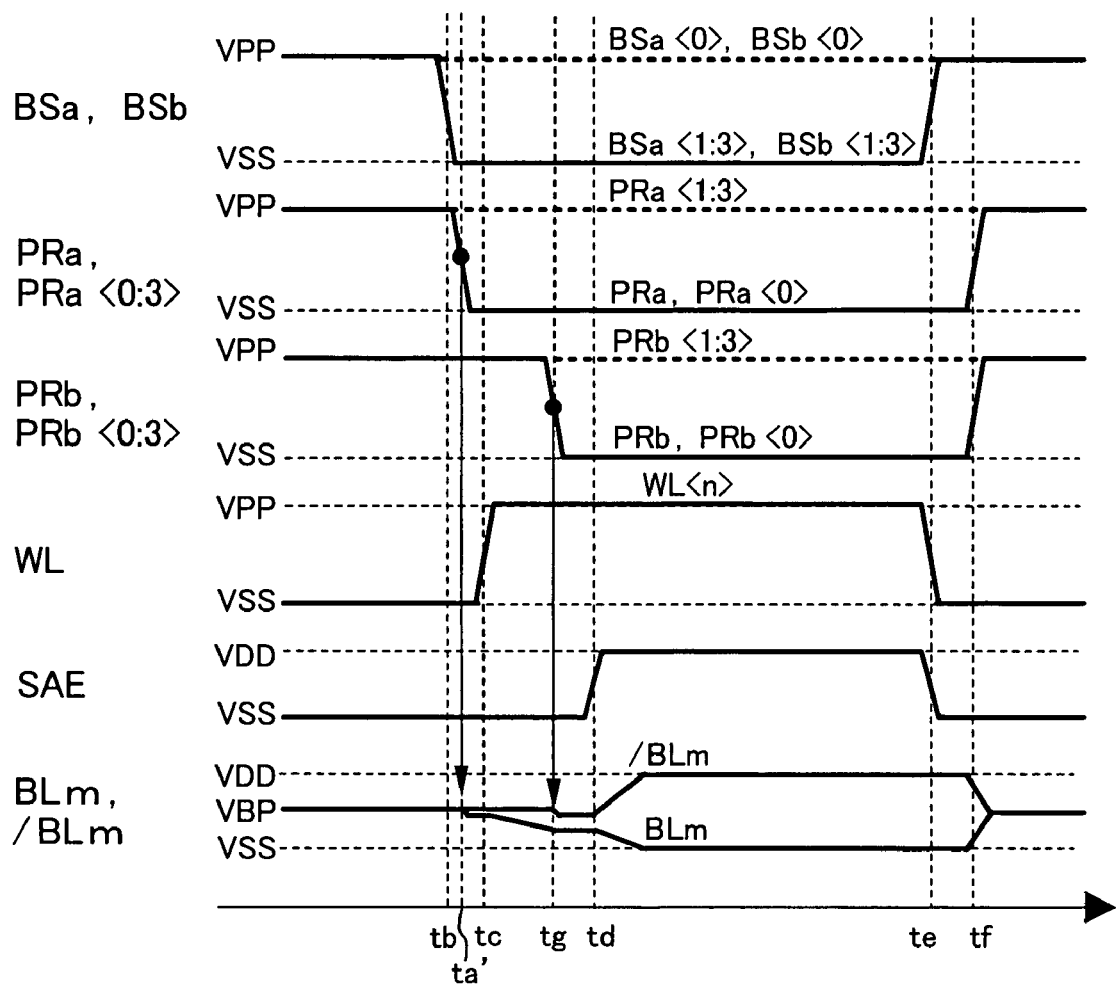
FIG. 5 is a timing chart for showing a read operation of a semiconductor memory device according to Modification 2.

FIG. 5 is a timing chart for showing a read operation of a semiconductor memory device according to Modification 2.

In the read operation of FIG. 5, in the semiconductor memory device of FIG. 3, a signal the same as that on the precharge control signal line PRa is supplied to the precharge control signal line PRa<0> for controlling the precharge transistor 40a for precharging the local bit line BL10 connected to the memory cell to be accessed, and a signal the same as that on the precharge control signal line PRb is supplied to the precharge control signal line PRb<0> for controlling the precharge transistor 40b for precharging the local bit line /BL10 paired with the local bit line BL10.

On the other hand, the precharge control signal lines PRa<1:3> and PRb<1:3>for controlling the precharge transistors 41a through 43a and 41b through 43b for precharging the local bit lines BL11 through BL13 and /BL11 through /BL13 other than the local bit lines related to the memory access (which are designated as non-access local bit lines) are kept at the boosted voltage VPP, so as to continuously precharge the local bit lines BLl1 through BLl3 and /BLl1 through /BLl3. The rest of the read operation is performed in the same manner as in FIG. 4.

When the semiconductor memory device of FIG. 3 is operated in accordance with the timing chart of FIG. 5, the non-access local bit lines can be definitely kept at the precharge level. Therefore, the rapid precharge operation can be realized with the bit line noise suppressed as in the read operation of FIG. 4, and in addition, it is possible to suppress a failure in which the charge keeping characteristic of a memory cell is degraded because the precharge level of the non-access local bit lines is largely varied by a short-circuit of the local bit lines or the like, and thus, fault tolerance can be improved.

Modification 3

Figure 6:
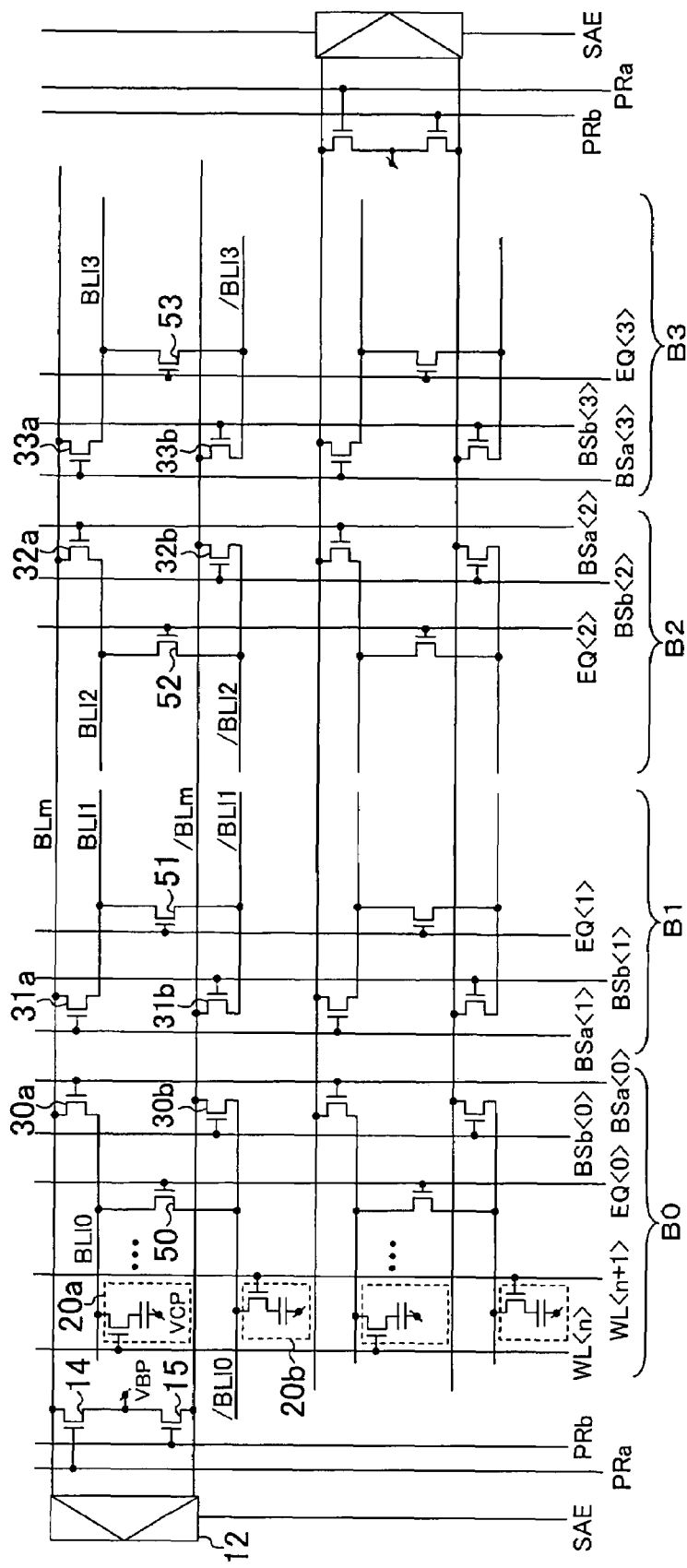
FIG. 6 is a circuit diagram for showing the configuration of a semiconductor memory device according to Modification 3.

FIG. 6 is a circuit diagram for showing the configuration of a semiconductor memory device according to Modification 3. The semiconductor memory device of FIG. 6 is obtained by further adding equalizing transistors 50, 51, 52, 53, etc. working as an equalizing circuit to the semiconductor memory device of FIG. 1.

The equalizing transistor 50 connects the local bit lines BLl0 and /BLl0 to each other in accordance with a signal on an equalizing control signal line EQ<0>. Similarly, the equalizing transistor 51 connects the local bit lines BLl1 and /BLl1 to each other in accordance with a signal on an equalizing control signal line EQ<1>, the equalizing transistor 52 connects the local bit lines BLl2 and /BLl2 to each other in accordance with a signal on an equalizing control signal line EQ<2>, and the equalizing transistor 53 connects the local bit lines BLl3 and /BLl3 to each other in accordance with a signal on an equalizing control signal line EQ<3>.

Figure 7:
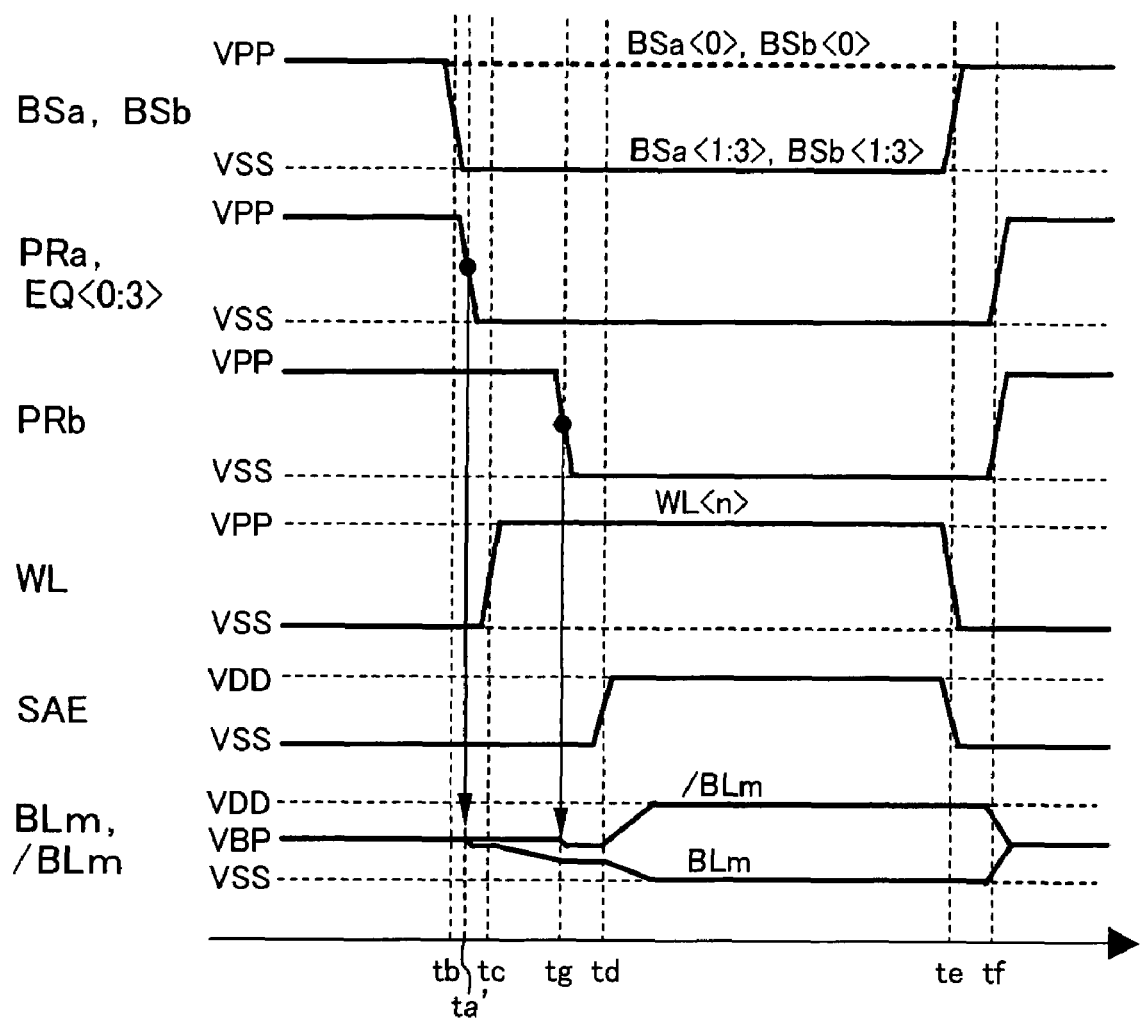
FIG. 7 is a timing chart for showing a read operation of the semiconductor memory device of FIG. 6.

FIG. 7 is a timing chart for showing a read operation of the semiconductor memory device of FIG. 6. In the semiconductor memory device of FIG. 6, a signal the same as the signal on the precharge control signal line PRa for controlling the precharge transistor 14 is supplied to the equalize control signal lines EQ<0:3>. The rest of the read operation is performed in the same manner as in the semiconductor memory device of FIG. 1.

In the semiconductor memory device of FIG. 6, the bit line noise can be suppressed in the same manner as in the semiconductor memory device of FIG. 1, and in addition, the bit line precharge can be performed rapidly with the minimum area overhead, so as to realize a rapid memory cycle.

It is noted that each of the equalizing transistors 50 through 53 connected to the local bit lines may be constructed from one transistor or a plurality of transistors each having the same structure as the memory cell transistor, namely, having substantially the same size as the memory cell transistor, and in particularly, having substantially the same electric characteristic. Thus, the area of the memory cell array can be reduced.

Alternatively, similar equalizing transistors may be additionally included in the semiconductor memory device of FIG. 3. Thus, rapid precharge can be performed.

Modification 4

Figure 8:
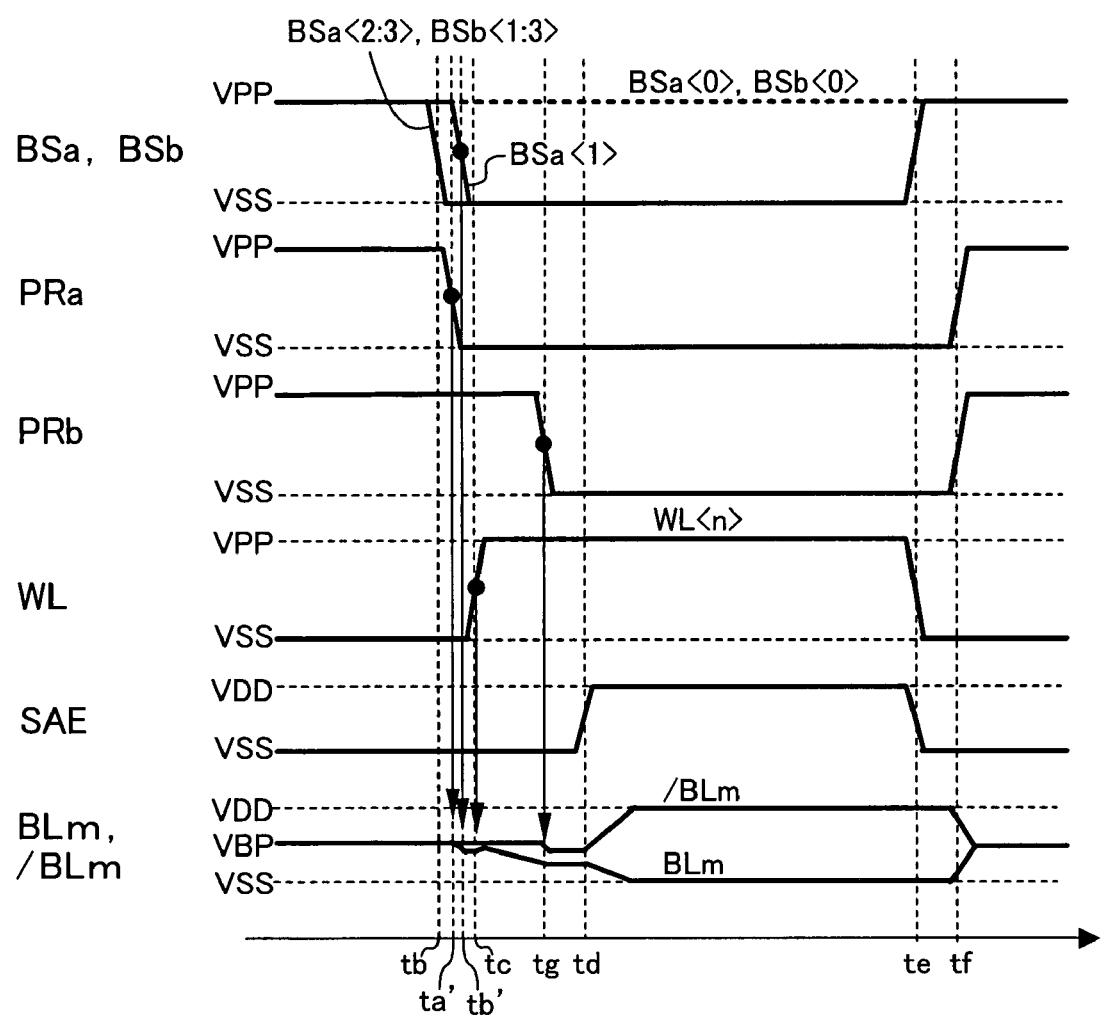
FIG. 8 is a timing chart for showing a read operation of a semiconductor memory device according to Modification 4.

FIG. 8 is a timing chart for showing a read operation of a semiconductor memory device according to Modification 4. In the read operation of FIG. 8, in the semiconductor memory device of FIG. 1, one of hierarchical switches connected to reading global bit lines out of the hierarchical switches of a block not accessed (non-access block) is controlled independently of the other hierarchical switches. Also, each of the hierarchical switches 30a through 33a and 30b through 33b is constructed from one transistor or a plurality of transistors each having the same structure as the memory cell transistor, namely, having substantially the same size and substantially the same electric characteristic as the memory cell transistor.

Specifically, for example, as shown in FIG. 8, at time tb, the hierarchical switch control signal lines BSa<2:3> and BSb<1:3> are set to the ground voltage VSS, so as to turn off the hierarchical switches 32a and 33a connected to the reading global bit lines in the non-access blocks and the hierarchical switches 31b through 33b connected to the reference global bit lines in the non-access blocks.

Thereafter, at time ta', the precharge control signal line PRa is set to the ground voltage VSS, so as to turn off the precharge transistor 14, and thus, the precharge of the reading global bit line BLm is terminated. Then, at time tb', the hierarchical switch control signal line BSa<1> is set to the ground voltage VSS, so as to turn off the hierarchical switch 31a connected to the reading global bit line in the non-access block B1.

Subsequently, the word line WL<n> is set to the boosted voltage VPP at time tc, the precharge control signal line PRb is set to the ground voltage VSS at time tg, and thus, the precharge of the reference global bit line is terminated. The rest of the read operation is performed in the same manner as in FIG. 2.

When the semiconductor memory device of FIG. 1 is operated in accordance with the timing chart of FIG. 8, the noise peculiar to the hierarchical bit line architecture can be suppressed, and in addition, it is possible to cancel the differential coupling noise otherwise caused when the potential of a reading global bit line alone is varied by the gate-source capacitance of a memory cell transistor in selecting the word line WL<n> (namely, the capacitance between the word line WL<n> and the local bit line BLl).

In other words, correspondingly to the variation of increasing the bit line potential caused by the gate-source coupling in selecting the word line WL<n> (namely, the coupling between the word line WL<n> and the local bit line BLl), the potential of the reading bit line is previously lowered through the gate-source coupling of the hierarchical switch 31a in turning off the hierarchical switch 31a (namely, the coupling between the hierarchical switch control signal line BSa<1> and the global bit line BLm).

The gate-source capacitance is set to be equal by using the memory cell transistors and the hierarchical switches, and the voltages on the hierarchical switch control signal lines BSa<1:3> and BSb<1:3> are controlled so that potential variation caused by coupling of one hierarchical switch can appear on the reading bit line. Therefore, the differential noise otherwise caused in selecting the word line can be completely cancelled.

Modification 5

Figure 9:
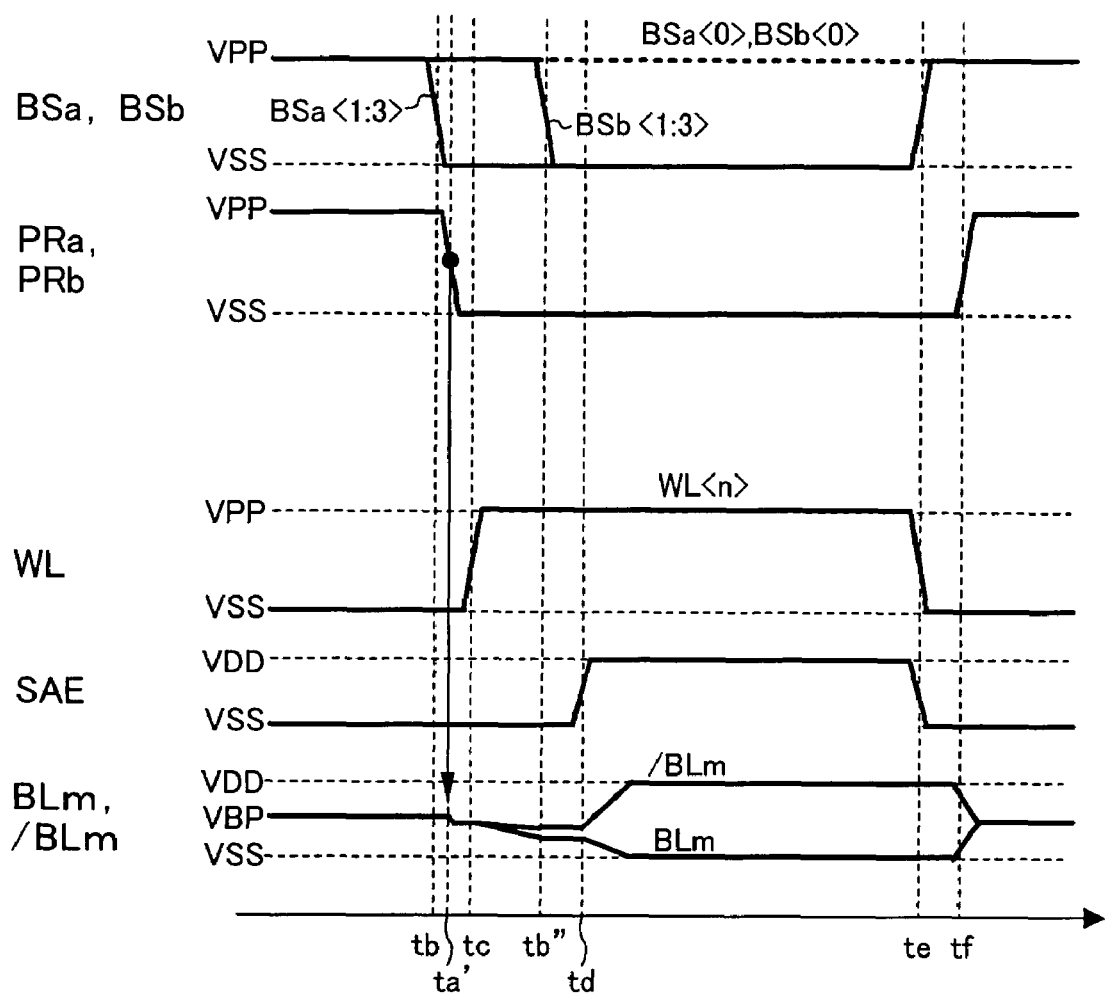
FIG. 9 is a timing chart for showing a read operation of a semiconductor memory device according to Modification 5.

FIG. 9 is a timing chart for showing a read operation of a semiconductor memory device according to Modification 5. In the read operation of FIG. 9, in the semiconductor memory device of FIG. 1, the hierarchical switch control signal lines BSa<1:3> are set to the ground voltage VSS at time tb, so as to turn off the hierarchical switches 31a through 33a connected to the reading global bit lines in the non-access blocks B1 through B3.

Subsequently, at time ta', the precharge control signal lines PRa and PRb are set to the ground voltage VSS, and thus, the precharge of the global bit lines BLm and /BLm is terminated. Thereafter, at time tc, the word line WL<n> is set to the boosted voltage VPP, so as to read data onto the bit line from the memory capacitor of the memory cell to be read (charge sharing is performed).

After terminating the charge sharing, the hierarchical switch control signal lines BSb<1:3> are set to the ground voltages VSS at time tb", so as to turn off the hierarchical switches 31b through 33b connected to the reference global bit lines in the non-access blocks. Thereafter, the sense amplifier control signal line SAE is set to the array voltage VDD at time td so as to make the sense amplifier 12 start the amplification. The rest of the read operation is performed in the same manner as in FIG. 2.

When the semiconductor memory device of FIG. 1 is operated in accordance with the timing chart of FIG. 9, all the hierarchical switches connected to the reference global bit lines are in an on state during the charge sharing period, and hence, the total bit line capacitance of the reference bit lines can be made relatively large as compared with that of the reading bit lines. Therefore, the potential variation of the reference global bit lines caused by the adjacent bit line capacitance when the potential of the reading global bit lines is varied through the charge sharing can be suppressed, so that the operation margin can be increased by reducing the noise from adjacent bit lines.

Although all the hierarchical switches connected to the reference global bit lines are placed in an on state during the charge sharing period in this modification, merely a part of the hierarchical switches connected to the reference global bit lines in the non-access blocks may be placed in an on state.

Modification 6

Figure 10:
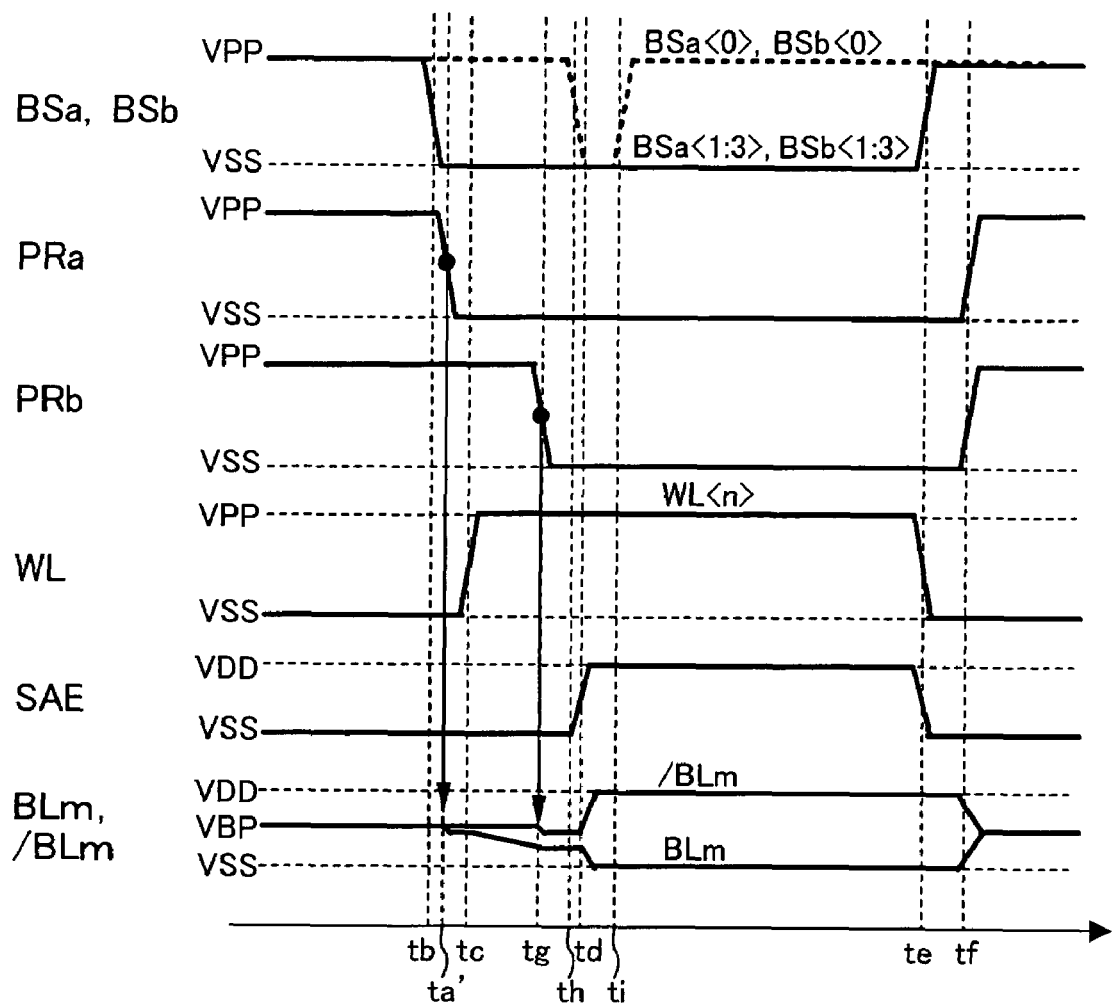
FIG. 10 is a timing chart for showing a read operation of a semiconductor memory device according to Modification 6.

FIG. 10 is a timing chart for showing a read operation of a semiconductor memory device according to Modification 6. In the read operation of FIG. 10, in the semiconductor memory device of FIG. 1, the hierarchical switch control signal lines BSa<0:3> and BSb<0:3> are set to the ground voltage VSS at time th after terminating the charge sharing, so as to turn off all the hierarchical switches 30a through 33a and 30b through 33b including the hierarchical switches 30a and 30b of the access block.

Thereafter, the sense amplifier control signal line SAE is set to the array voltage VDD at time td so as to make the sense amplifier 12 start the amplification, and the hierarchical switch control signal lines BSa<0> and BSb<0> are set to the boosted voltage VPP at time ti, so as to turn on the hierarchical switches 30a and 30b of the access block again. The rest of the read operation is performed in the same manner as in FIG. 2.

When the semiconductor memory device of FIG. 1 is operated in accordance with the timing chart of FIG. 10, the total bit line capacitance obtained when the sense amplifier 12 performs the amplification corresponds to the capacitance of the global bit lines BLm and /BLm alone, and hence, the sense amplifier 12 can rapidly perform the amplification.

It is noted that the control signal timing employed before terminating the charge sharing may be different from that shown in FIG. 10.

Modification 7

Figure 11:
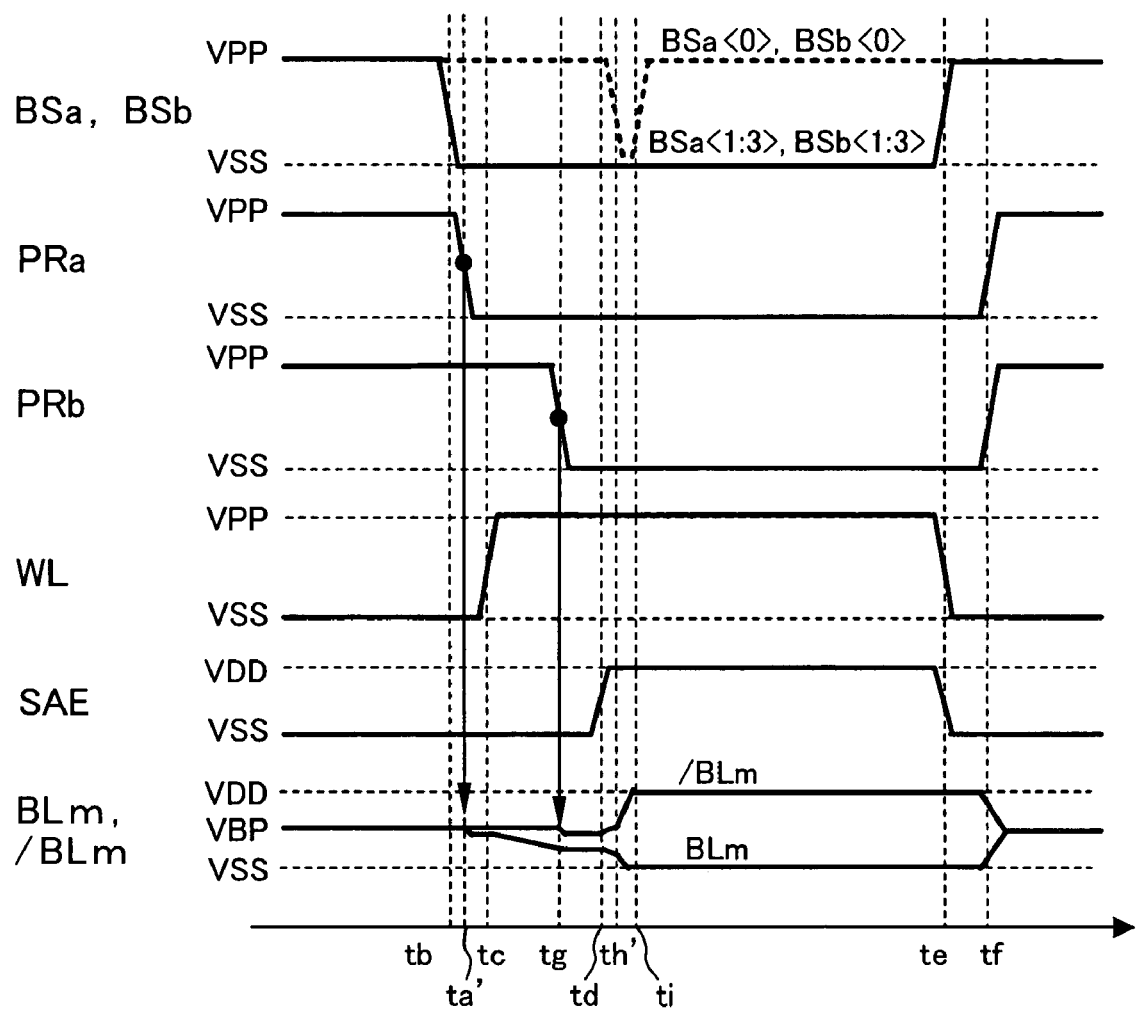
FIG. 11 is a timing chart for showing a read operation of a semiconductor memory device according to Modification 7.

FIG. 11 is a timing chart for showing a read operation of a semiconductor memory device according to Modification 7. In the read operation of FIG. 11, in the semiconductor memory device of FIG. 1, after allowing the sense amplifier 12 to start the amplification at time td, all the hierarchical switches 30a through 33a and 30b through 33b are turned off at time th'. Thereafter, merely the hierarchical switches 30a and 30b of the access block are turned on again at time ti. The rest of the read operation is performed in the same manner as in FIG. 2.

When the semiconductor memory device of FIG. 1 is operated in accordance with the timing chart of FIG. 11, at the initial stage of the sense amplifier 12 starting the amplification, the bit line capacitance is large and hence the amplification by the sense amplifier 12 is performed slowly, but after the time ti, the total bit line capacitance corresponds to the capacitance of the global bit lines BLm and /BLm alone, and therefore, the sense amplifier 12 can rapidly perform the amplification. In other words, since the amplification is performed slowly at the early stage of the amplification by the sense amplifier 12, the operation margin can be increased through improvement of the sensibility obtained with a small signal, and at the same time, time necessary for maximizing the amplitude can be shortened.

It is noted that the control signal timing employed before terminating the charge sharing may be different from that shown in FIG. 11.

Modification 8

Figure 12:
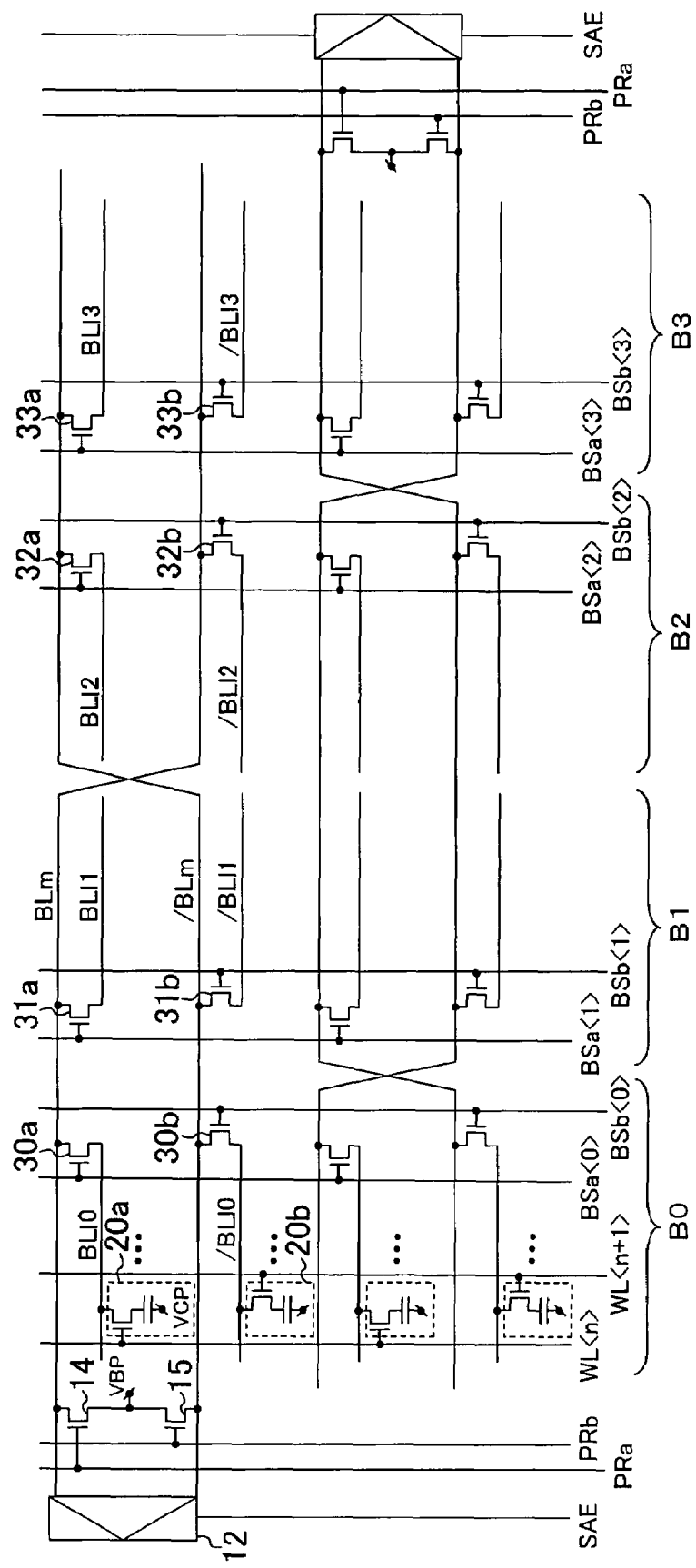
FIG. 12 is a circuit diagram for showing the configuration of a semiconductor memory device according to Modification 8.

FIG. 12 is a circuit diagram for showing the configuration of a semiconductor memory device according to Modification 8. The semiconductor memory device of FIG. 12 is configured in the same manner as the semiconductor memory device of FIG. 1 except that each global bit line pair has a twisted structure (with, for example, global bit lines BLm and /BLm twisted). The semiconductor memory device of FIG. 12 is supplied with signals as shown in, for example, FIG. 10 or 11.

As described above, in an embedded-DRAM employing the sub-100 nm process, a portion of the memory cell array disposed beneath a first metal layer is laid out by using the special process rule, and hence, the periodical arrangement of memory cells is necessary for reducing the array area and easing the fabrication. Therefore, it is difficult to employ the twisted structure for cancelling local bit line noise.

In the hierarchical bit line architecture, the ratio of side coupling capacitance to the total bit line capacitance is large as compared with that in the non-hierarchical bit line architecture. In particular, in a global bit line formed in an upper layer, the coupling capacitance with another bit line adjacent in the vicinity of the minimum pitch is dominant, and hence, it is easily affected by the influence of the bit line interference noise. Therefore, the global bit line pair employs the twisted bit line structure in this modification.

In the semiconductor memory device of FIG. 12, during the amplification performed by the sense amplifier 12, all the hierarchical switches are in an off state so as to disconnect the local bit lines, and when seen from the sense amplifier 12, there is a period when the twisted global bit line pair alone is connected. Therefore, the bit line noise caused when the potential of the global bit line is largely varied can be largely reduced, so as to increase the operation margin.

It is noted that the twisting method for the global bit lines may be different from that shown in FIG. 12.

Modification 9

Figure 13:
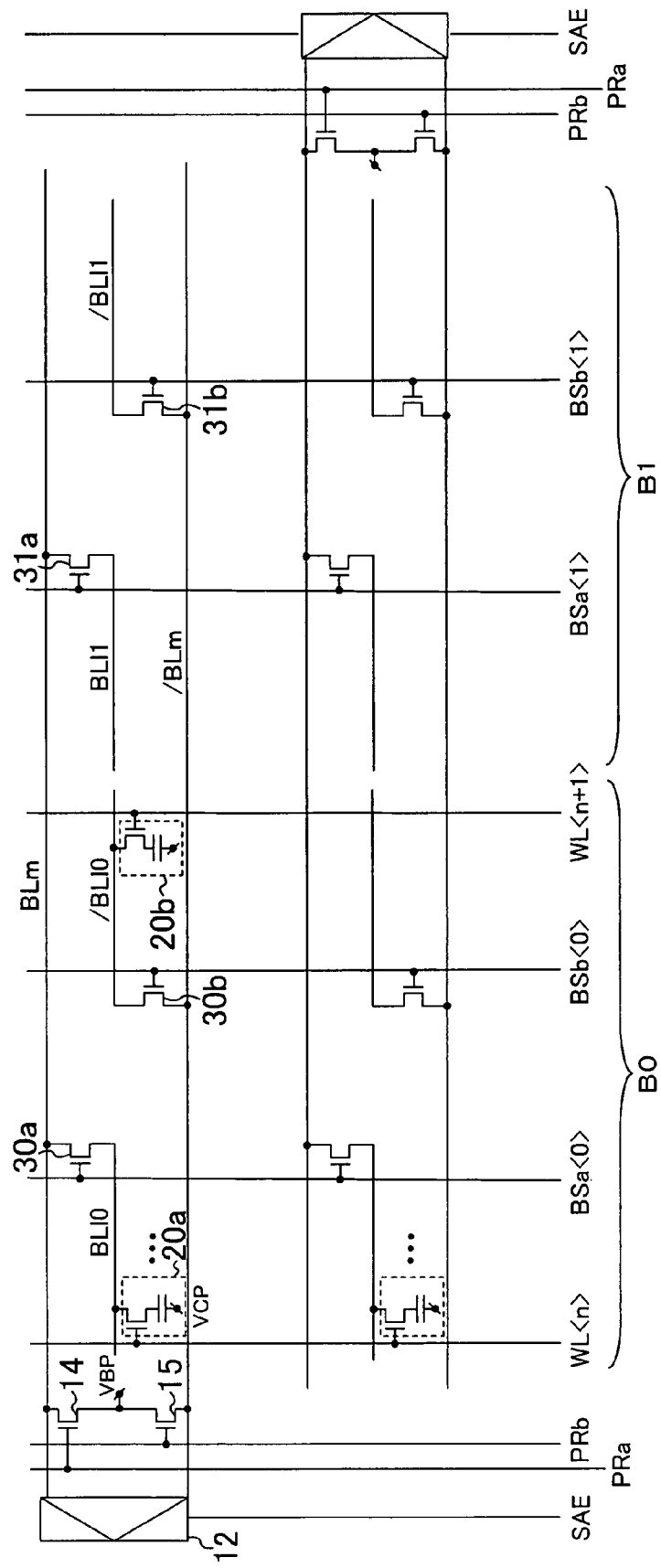
FIG. 13 is a circuit diagram for showing the configuration of a semiconductor memory device according to Modification 9.

FIG. 13 is a circuit diagram for showing the configuration of a semiconductor memory device according to Modification 9. This semiconductor memory device is configured in the same manner as the semiconductor memory device of FIG. 1 except that a local bit line pair employs an open bit line architecture. The semiconductor memory device of FIG. 13 is provided with signals as shown in, for example, FIG. 10 or 11.

In the open bit line architecture, memory cells can be finely laid out, and hence, the effect to reduce the area is remarkable. However, particularly during the amplification performed by a sense amplifier, potential of plurality of adjacent bit lines is biased to be high or low, and hence, there is a problem that a noise margin is reduced. In other words, out of bit lines adjacent to one another along the direction of the word lines, the number of bit lines having high potential through the amplification and the number of bit lines having low potential through the amplification are the same in employing the folded bit line architecture but are different in employing the open bit line architecture. In the worst case, all the adjacent bit lines have high potential or low potential.

In the semiconductor memory device of FIG. 13, during the amplification performed by the sense amplifier 12, all the hierarchical switches are in an off state so as to disconnect the local bit lines, and when seen from the sense amplifier 12, there is a period when the folded global bit line pair alone is connected. Therefore, the bit line noise peculiar to the open bit line architecture caused when the global bit line potential is largely varied can be suppressed, so as to increase the operation margin.

It goes without saying that the global bit lines may be twisted in the semiconductor memory device of FIG. 13.

Modification 10

Figure 14:
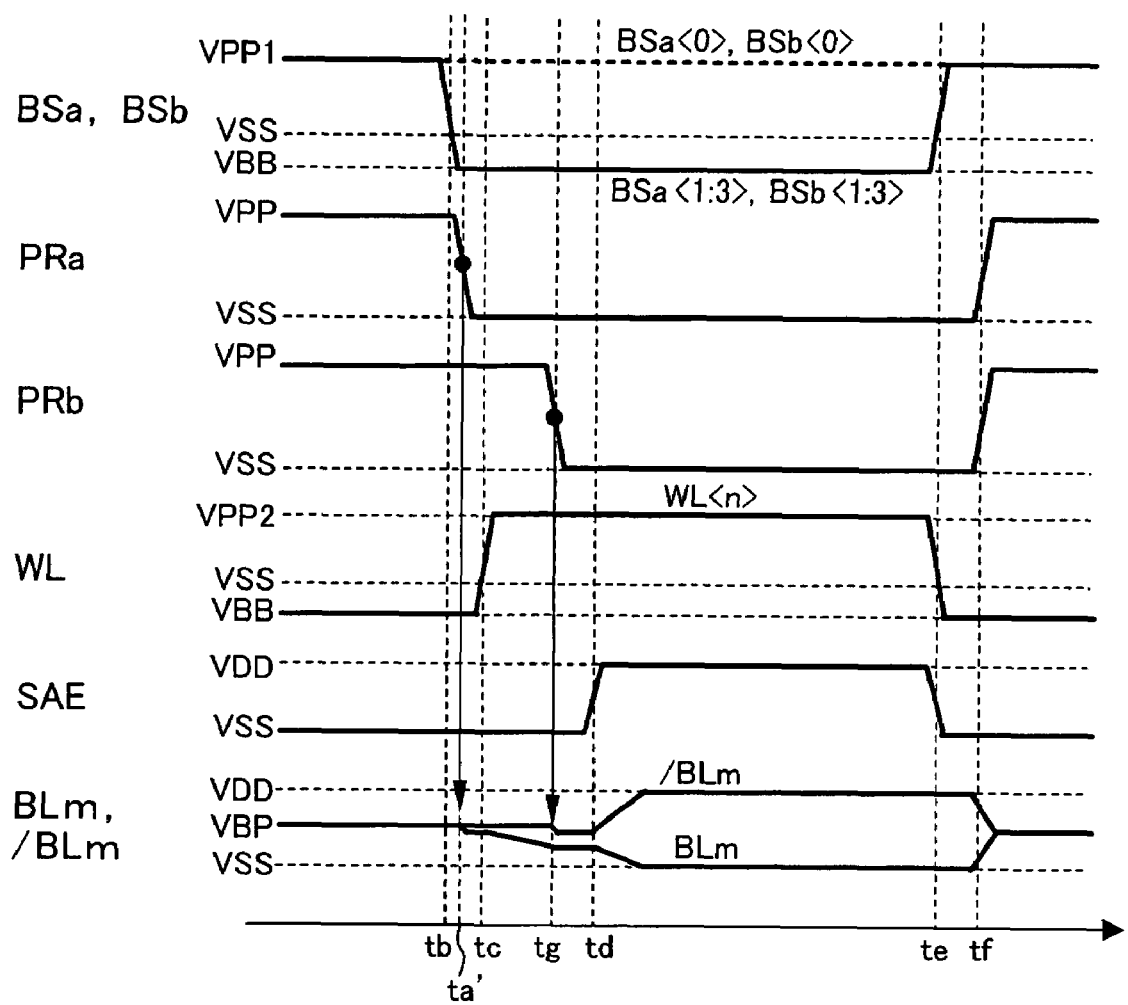
FIG. 14 is a timing chart for showing a read operation of a semiconductor memory device according to Modification 10.

FIG. 14 is a timing chart for showing a read operation of a semiconductor memory device according to Modification 10. In this modification, each hierarchical switch is constructed from one transistor or a plurality of transistors each having substantially the same size as each memory cell transistor, and in particular, having substantially the same electric characteristic as the memory cell transistor. Furthermore, what is called a negative word line architecture is employed, and each memory cell transistor is placed in an off state when its gate voltage is a negative voltage VBB. Similarly, each hierarchical switch is placed in an off state when its control signal (gate voltage) is the negative voltage VBB.

In the read operation of FIG. 14, when the hierarchical switch control signal lines BSa<0:3> and BSb<0:3> are set to a boosted voltage VPP1, the corresponding hierarchical switches are turned on, and when they are set to the negative voltage VBB, the corresponding hierarchical switches are turned off. Also, when the word lines WL<n>, etc. are set to a boosted voltage VPP2, the corresponding memory cell transistors are turned on, and when they are set to the negative voltage VBB, the corresponding memory cell transistors are turned off. The rest of the read operation is performed in the same manner as in FIG. 2.

The negative word line architecture is technique necessary, in an embedded-DRAM of the sub-100 nm generation in particular, for improving the charge keeping characteristic by reducing a leakage current caused by a short channel effect while reducing the cell size by thinning a gate oxide film of each memory cell transistor. Since a leakage current occurring in an off state can be suppressed by employing this architecture, the threshold voltage of the memory cell transistor can be lowered. Therefore, the on current of the memory cell transistor can be increased to rapidly read data of the memory cell.

In this modification, the area of the memory cell array can be minimized while keeping the periodicity in the layout of the memory cell array including the hierarchical switches and the memory cells. Also, since a leakage current occurring in an off state can be suppressed, the on current of each hierarchical switch can be increased so that data on a local bit line can be more rapidly transmitted to a global bit line.

It is noted that the timing and the potential of signals on the precharge control signal lines PRa and PRb may be different from those shown in FIG. 14.

Figure 15:
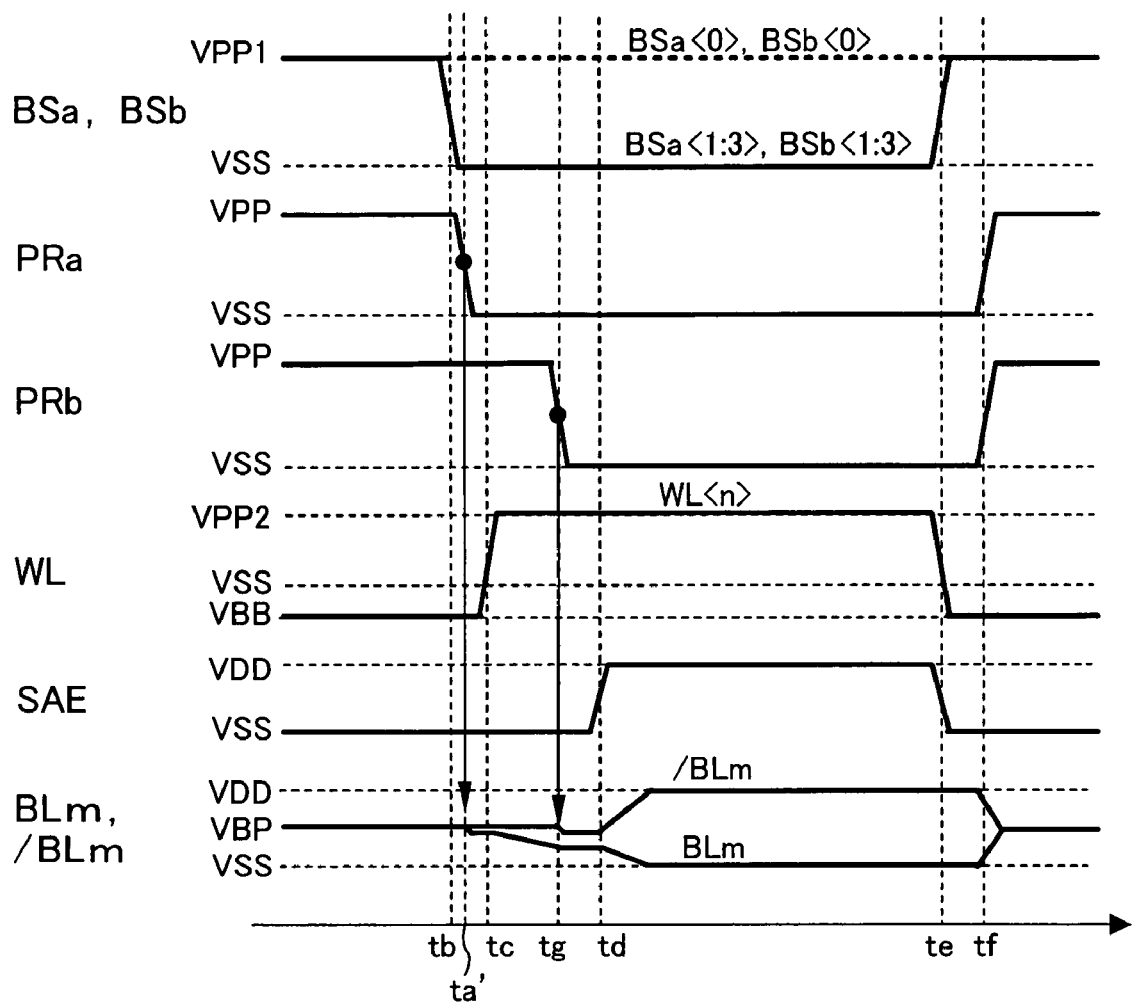
FIG. 15 is a timing chart for showing a read operation of a semiconductor memory device according to a modification of Modification 10.
Figure 16:
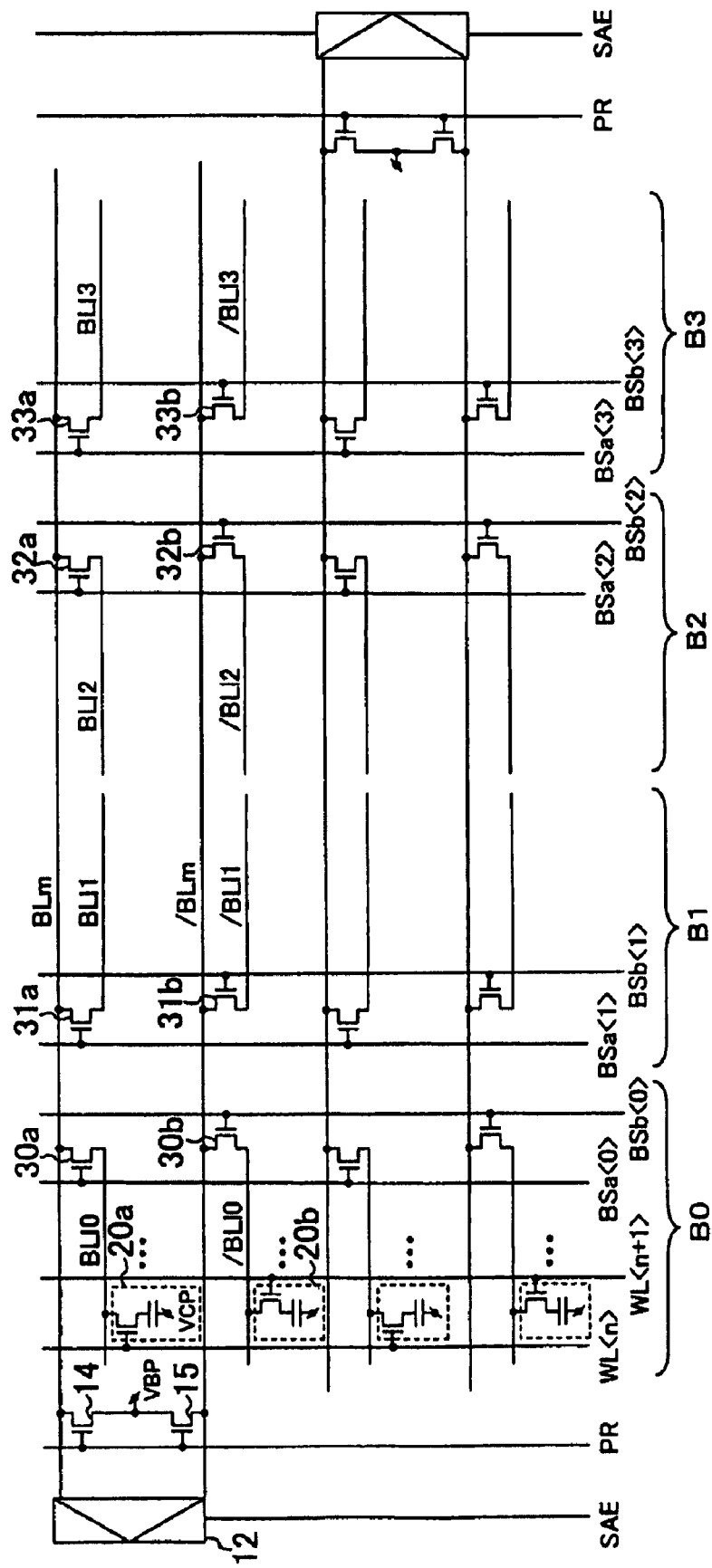
FIG. 16 is a circuit diagram for showing the configuration of a conventional semiconductor device.
Figure 17:
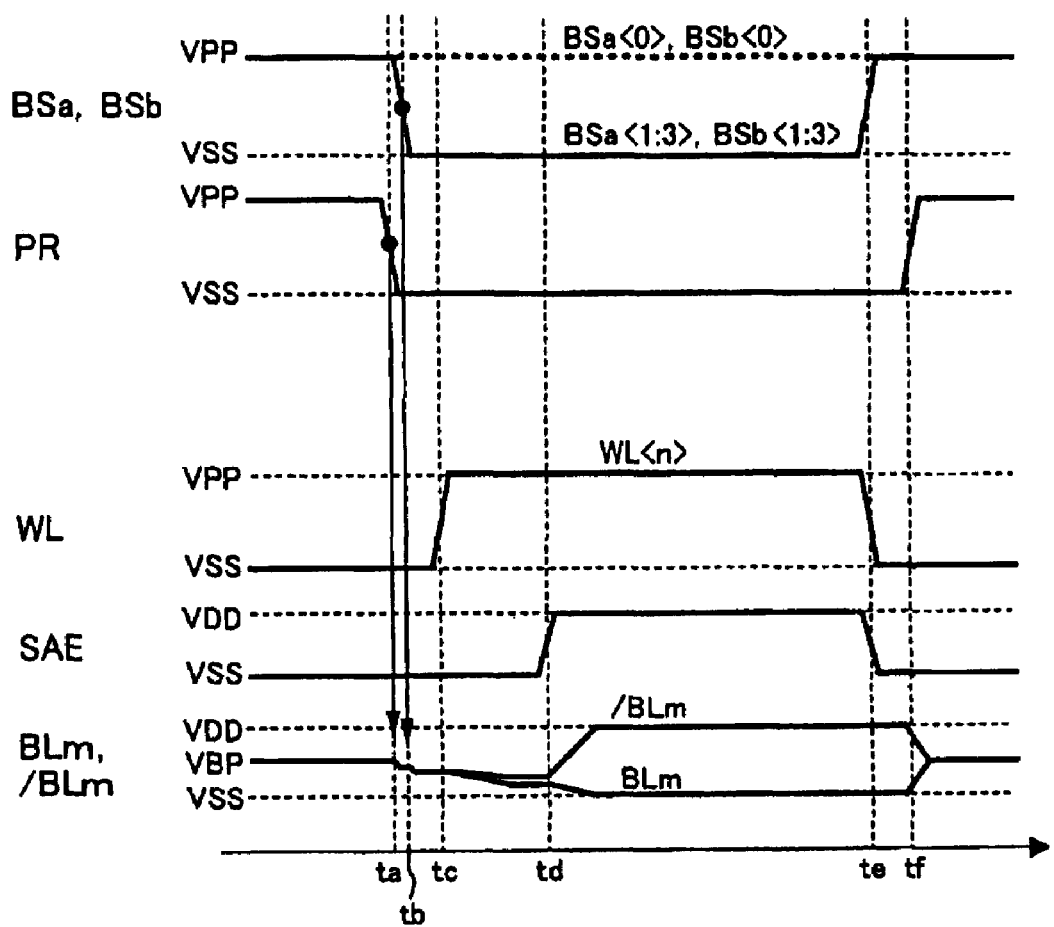
FIG. 17 is a timing chart for showing a read operation of the semiconductor memory device of FIG. 16.

FIG. 15 is a timing chart for showing a read operation of a semiconductor memory device according to a modification of Modification 10. This semiconductor memory device is the same as that of Modification 10 except that each hierarchical switch is placed in an off state when the gate voltage is the ground voltage VSS in the semiconductor memory device of FIG. 1.

In the negative word line architecture, stability of a negative voltage level for determining the capacitor charge keeping characteristic is severely required. The negative voltage VBB is generally generated by using a charge pump, and it is difficult to increase its current supply power, and therefore, it is preferable to stabilize the voltage level by reducing current consumption of a circuit to which the negative voltage VBB is supplied. Also, a characteristic required of the hierarchical switch is ability to rapidly transmit bit line data, and a leakage current occurring in an off state need not be reduced as much as in a memory cell transistor and may be generally equivalent to that of a logic transistor. Therefore, each hierarchical switch is placed in an off state when the gate voltage is the ground voltage VSS.

In the read operation of FIG. 15, while reducing the area of the memory cell array with keeping the periodicity in the layout of the memory cell array including the hierarchical switches and the memory cells, the on current of each hierarchical switch is increased so that data on a local bit line can be more rapidly transmitted to a global bit line. Furthermore, since a negative voltage power source allows a current to flow merely when the word line is discharged, the negative voltage level can be stabilized with the supplied current suppressed, and hence, the memory capacitor charge keeping characteristic and the low power consumption characteristic can be both improved.

It is noted that the timing and the potential of signals on the precharge control signal lines PRa and PRb may be different from those shown in FIG. 15.

Furthermore, in each of the read operations shown in FIGS. 14 and 15, the boosted voltages VPP1 and VPP2 may be the same as or different from each other. For example, when the boosted voltage VPP2 is set to an optimum voltage for a memory cell transistor for rapidly transferring charge of a memory capacitor and the boosted voltage VPP1 is set to an optimum voltage for a hierarchical switch for rapidly transmitting bit line data, lower power consumption can be realized. Also, for example, the boosted voltage VPP2 may be lower than the boosted voltage VPP1.

In the aforementioned embodiment, although the bit line precharge voltage VBP is set as a precharge level, the ground voltage VSS may be set as the precharge level instead.

Thus, a voltage between the gate and the source (namely, the global bit line BLm and the local bit lines BL0 through BL3) of a hierarchical switch (i.e., an NMOS transistor) can be increased particularly in an on state, and therefore, the charge transferring speed of the hierarchical switch attained during the charge sharing period and during the amplification performed by the sense amplifier can be improved.

Furthermore, for example, the hierarchical bit line structure and a shared sense amplifier method may be combined.

Although a preferred embodiment of the invention has been described in detail, the present invention is not limited to the above-described embodiment and can be variously practiced without departing from the spirit and scope thereof.

Since the bit line noise can be suppressed for improving the reliability, the present invention is useful for a semiconductor memory device and the like having the hierarchical bit line architecture.

What is claimed is:

1. A semiconductor memory device comprising:
   a plurality of memory cells arranged in the form of a matrix;

first and second global bit lines corresponding to different columns of said plurality of memory cells;

a sense amplifier for differentially amplifying a voltage between said first and second global bit lines;

a first local bit line connected to memory cells, out of said plurality of memory cells, belonging to said column corresponding to said first global bit line;

a second local bit line connected to memory cells, out of said plurality of memory cells, belonging to said column corresponding to said second global bit line and belonging to the same rows as said memory cells connected to said first local bit line;

a third local bit line connected to memory cells, out of said plurality of memory cells, belonging to said column corresponding to said first global bit line and not connected to said first local bit line;

a fourth local bit line connected to memory cells, out of said plurality of memory cells, belonging to said column corresponding to said second global bit line and belonging to the same rows as said memory cells connected to said third local bit line;

a first hierarchical switch for mutually connecting said first global bit line and said first local bit line;

a second hierarchical switch for mutually connecting said second global bit line and said second local bit line;

a third hierarchical switch for mutually connecting said first global bit line and said third local bit line;

a fourth hierarchical switch for mutually connecting said second global bit line and said fourth local bit line;

a first precharge circuit connected between a precharge power source and said first global bit line for precharging said first global bit line; and a second precharge circuit connected between said precharge power source and said second global bit line for precharging said second global bit line, wherein when a memory cell connected to said first local bit line is read, said third hierarchical switch enters an off state from an on state, and said first precharge circuit terminates a precharge operation thereof after said third hierarchical switch enters the off state and before a selected word line connected to said memory cell to be read is activated.

2. The semiconductor memory device of claim 1,
wherein said fourth hierarchical switch enters an off state from an on state before said first precharge circuit terminates the precharge operation thereof, and
said second precharge circuit terminates a precharge operation thereof after said selected word line is activated and before said sense amplifier starts amplification.

3. The semiconductor memory device of claim 2, further comprising:
a first local bit line precharge circuit connected between said precharge power source and said first local bit line for precharging said first local bit line;
a second local bit line precharge circuit connected between said precharge power source and said second local bit line for precharging said second local bit line;
a third local bit line precharge circuit connected between said precharge power source and said third local bit line for precharging said third local bit line; and
a fourth local bit line precharge circuit connected between said precharge power source and said fourth local bit line for precharging said fourth local bit line,
wherein said first local bit line precharge circuit terminates a precharge operation thereof after said third and fourth hierarchical switches enter an off state and before said selected word line connected to said memory cell to be read is activated, and
said second local bit line precharge circuit terminates a precharge operation thereof after said selected word line is activated and before said sense amplifier starts the amplification.

4. The semiconductor memory device of claim 3,
wherein said first and third local bit line precharge circuits are controlled in accordance with the same control signal as said first precharge circuit, and
said second and fourth local bit line precharge circuits are controlled in accordance with the same control signal as said second precharge circuit.

5. The semiconductor memory device of claim 3,
wherein said third local bit line precharge circuit continues a precharge operation thereof after said first local bit line precharge circuit terminates the precharge operation thereof, and
said fourth local bit line precharge circuit continues a precharge operation thereof after said second local bit line precharge circuit terminates the precharge operation thereof.

6. The semiconductor memory device of claim 3,
wherein each of said first, second, third and fourth local bit line precharge circuits includes one transistor or plural transistors each having substantially the same size as a memory cell transistor included in each of said plurality of memory cells.

7. The semiconductor memory device of claim 6,
wherein said one transistor or plural transistors included in each of said first, second, third and fourth local bit line precharge circuits have substantially the same electric characteristic as said memory cell transistor included in each of said plurality of memory cells.

8. The semiconductor memory device of claim 1, further comprising:
a first equalizing circuit for mutually connecting said first local bit line and said second local bit line; and
a second equalizing circuit for mutually connecting said third local bit line and said fourth local bit line,
wherein said first and second equalizing circuits enter an off state from an on state after said selected word line is activated and before said sense amplifier starts amplification.

9. The semiconductor memory device of claim 8,
wherein each of said first and second equalizing circuits includes one transistor or plural transistors each having substantially the same size as a memory cell transistor included in each of said plurality of memory cells.

10. The semiconductor memory device of claim 9,
wherein said one transistor or plural transistors included in each of said first and second equalizing circuits have substantially the same electric characteristic as said memory cell transistor included in each of said plurality of memory cells.

11. The semiconductor memory device of claim 1,
wherein a plurality of local bit lines respectively connected to different memory cells, out of said plurality of memory cells, belonging to said column corresponding to said first global bit line and not connected to said first local bit line are included as said third local bit line,
a plurality of hierarchical switches each for mutually connecting said first global bit line and corresponding one of said plurality of local bit lines included as said third local bit line are included as said third hierarchical switch, each of said first, second, third and fourth hierarchical switches includes one transistor or plural transistors each having the same structure as a memory cell transistor included in each of said plurality of memory cells, and
one of said plurality of hierarchical switches included as said third hierarchical switch enters an off state from an on state after said first precharge circuit terminates the precharge operation thereof and before said selected word line is activated.

12. The semiconductor memory device of claim 1,
wherein a plurality of local bit lines respectively connected to different memory cells, out of said plurality of memory cells, belonging to said column corresponding to said second global bit line and not connected to said second local bit line are included as said fourth local bit line,
a plurality of hierarchical switches each for mutually connecting said second global bit line and corresponding one of said plurality of local bit lines included as said fourth local bit line are included as said fourth hierarchical switch, and
at least one of said plurality of hierarchical switches included as said fourth hierarchical switch enters an off state from an on state after said selected word line is activated and before said sense amplifier starts amplification.

13. The semiconductor memory device of claim 12,
wherein all of said plurality of hierarchical switches included as said fourth hierarchical switch enter an off state from an on state after said selected word line is activated and before said sense amplifier starts the amplification.

14. The semiconductor memory device of claim 1,
wherein said first and second hierarchical switches are placed in an off state during a given period including start of amplification performed by said sense amplifier.

15. The semiconductor memory device of claim 14,
wherein said first global bit line and said second global bit line are twisted.

16. The semiconductor memory device of claim 14,
wherein said first global bit line and said second global bit line together form a folded bit line pair, and
said first, second, third and fourth local bit lines are arranged in an open bit line architecture.

17. The semiconductor memory device of claim 1,
wherein said first and second hierarchical switches are placed in an off state during a given period after said sense amplifier starts amplification.

18. The semiconductor memory device of claim 17,
wherein said first global bit line and said second global bit line are twisted.

19. The semiconductor memory device of claim 17,
wherein said first global bit line and said second global bit line together form a folded bit line pair, and
said first, second, third and fourth local bit lines are arranged in an open bit line architecture.

20. The semiconductor memory device of claim 1,
wherein each of said first, second, third and fourth hierarchical switches includes one transistor or plural transistors each having substantially the same size as a memory cell transistor included in each of said plurality of memory cells.

21. The semiconductor memory device of claim 20,
wherein said one transistor or plural transistors included in each of said first, second, third and fourth hierarchical switches have substantially the same electric characteristic as said memory cell transistor included in each of said plurality of memory cells.

22. The semiconductor memory device of claim 20,
wherein a negative voltage is supplied as a control voltage for placing said memory cell transistor included in each of said plurality of memory cells and said first, second, third and fourth hierarchical switches in an off state.

23. The semiconductor memory device of claim 22,
wherein a control voltage supplied for placing said memory cell transistor included in each of said plurality of memory cells in an on state is lower than a control voltage supplied for placing said first, second, third and fourth hierarchical switches in an on state.

24. The semiconductor memory device of claim 20,
wherein a negative voltage is supplied as a control voltage for placing said memory cell transistor included in each of said plurality of memory cells in an off state, and
a ground voltage is supplied as a control voltage for placing said first, second, third and fourth hierarchical switches in an off state.

25. The semiconductor memory device of claim 24,
wherein a control voltage supplied for placing said memory cell transistor included in each of said plurality of memory cells in an on state is lower than a control voltage supplied for placing said first, second, third and fourth hierarchical switches in an on state.

26. The semiconductor memory device of claim 1,
wherein each of said first, second, third and fourth hierarchical switches has a threshold voltage lower than a threshold voltage of a memory cell transistor included in each of said plurality of memory cells.

27. The semiconductor memory device of claim 1,
wherein a voltage output by said precharge power source is a ground voltage.

* * * * *